United States Patent
Khan et al.

(10) Patent No.: US 7,714,453 B2
(45) Date of Patent: May 11, 2010

(54) INTERCONNECT STRUCTURE AND FORMATION FOR PACKAGE STACKING OF MOLDED PLASTIC AREA ARRAY PACKAGE

(75) Inventors: Rezaur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 60 days.

(21) Appl. No.: 11/652,007

(22) Filed: Jan. 11, 2007

(65) Prior Publication Data

US 2007/0273049 A1 Nov. 29, 2007

Related U.S. Application Data

(60) Provisional application No. 60/799,657, filed on May 12, 2006.

(51) Int. Cl.
*H01L 23/28* (2006.01)
*H01L 29/40* (2006.01)
*H01L 29/06* (2006.01)
*H01L 23/02* (2006.01)
*H01L 23/34* (2006.01)
*H01L 23/48* (2006.01)
*H01L 23/52* (2006.01)

(52) U.S. Cl. .................. 257/787; 257/621; 257/622; 257/623; 257/678; 257/685; 257/686; 257/723; 257/737; 257/738; 257/777; 257/778; 257/E23.02; 257/E23.021; 257/E23.085; 257/E23.123; 257/E23.128

(58) Field of Classification Search .............. 257/678, 257/685–686, 723, 737–738, 777–778, 787, 257/621–623, E23.02, E23.021, E23.085, 257/E23.123, E23.128
See application file for complete search history.

(56) References Cited

U.S. PATENT DOCUMENTS 4,480,262 A 10/1984 Butt
4,560,826 A 12/1985 Burns et al.

(Continued)

FOREIGN PATENT DOCUMENTS

CN 1753178 A 3/2006

OTHER PUBLICATIONS

Dreiza et al., "Implement stacked package-on-package designs", Amkor Technology Inc., retrieved from the internet on Oct. 17, 2005 http://www.eetasia.com/ARTICLES/2005OCT/B/2005OCT17_EDA_MFG_TA.pdf., pp. 1-3.

(Continued)

*Primary Examiner*—Ida M Soward
(74) *Attorney, Agent, or Firm*—Sterne, Kessler, Goldstein & Fox, PLLC.

(57) ABSTRACT

Apparatuses, methods, and systems for improved integrated circuit packages are described. An integrated circuit (IC) package includes a substrate having opposing first and second surfaces, an IC die, a plurality of conductive elements, and an encapsulating material. The substrate has a plurality of contact pads on the first surface that are electrically coupled to a plurality of electrically conductive features on the second surface. The plurality of conductive elements is formed on the first surface of the substrate. The IC die is located on the first surface of the substrate. The encapsulating material encapsulates the IC die and a portion of each element of the plurality of conductive elements.

22 Claims, 36 Drawing Sheets

U.S. PATENT DOCUMENTS

| | | | | |
|---|---|---|---|---|
| 4,680,613 | A | 7/1987 | Daniels et al. | |
| 4,803,544 | A | 2/1989 | Holzschuh et al. | |
| 5,105,260 | A | 4/1992 | Butera | |
| 5,153,379 | A | 10/1992 | Guzuk et al. | |
| 5,294,826 | A | 3/1994 | Marcantonio et al. | |
| 5,350,943 | A | 9/1994 | Angerstein et al. | |
| 5,376,756 | A | 12/1994 | Kwon | |
| 5,389,816 | A | 2/1995 | Shimizu et al. | |
| 5,468,910 | A | 11/1995 | Knapp et al. | |
| 5,486,720 | A | 1/1996 | Kierse | |
| 5,497,032 | A | 3/1996 | Tsuji et al. | |
| 5,559,306 | A | 9/1996 | Mahulikar | |
| 5,608,265 | A | 3/1997 | Kitano et al. | |
| 5,642,261 | A | 6/1997 | Bond et al. | |
| 5,650,659 | A | 7/1997 | Mostafazadeh et al. | |
| 5,668,406 | A | 9/1997 | Egawa | |
| 5,889,316 | A | 3/1999 | Strobel et al. | |
| 5,977,626 | A | 11/1999 | Wang et al. | |
| 5,977,636 | A | 11/1999 | Sharan | |
| 5,986,340 | A | 11/1999 | Mostafazadeh et al. | |
| 6,011,303 | A | 1/2000 | Tanaka et al. | |
| 6,072,239 | A * | 6/2000 | Yoneda et al. | 257/730 |
| 6,092,281 | A | 7/2000 | Glenn | |
| 6,229,702 | B1 | 5/2001 | Tao et al. | |
| 6,395,582 | B1 | 5/2002 | Sohn et al. | |
| 6,414,396 | B1 * | 7/2002 | Shim et al. | 257/778 |
| 6,432,742 | B1 | 8/2002 | Guan et al. | |
| 6,501,184 | B1 | 12/2002 | Shin et al. | |
| 6,507,114 | B2 | 1/2003 | Hui et al. | |
| 6,528,876 | B2 | 3/2003 | Huang | |
| 6,552,428 | B1 | 4/2003 | Huang et al. | |
| 6,614,102 | B1 | 9/2003 | Hoffman et al. | |
| 6,617,200 | B2 | 9/2003 | Sone | |
| 6,707,140 | B1 | 3/2004 | Nguyen et al. | |
| 6,717,245 | B1 * | 4/2004 | Kinsman et al. | 257/678 |
| 6,737,750 | B1 | 5/2004 | Hoffman et al. | |
| 6,765,287 | B1 * | 7/2004 | Lin | 257/686 |
| 6,775,140 | B2 | 8/2004 | Shim et al. | |
| 6,825,108 | B2 | 11/2004 | Khan et al. | |
| 6,838,761 | B2 | 1/2005 | Karnezos | |
| 6,848,912 | B2 | 2/2005 | Zhang | |
| 6,853,070 | B2 | 2/2005 | Khan et al. | |
| 6,861,750 | B2 | 3/2005 | Zhao et al. | |
| 6,876,553 | B2 | 4/2005 | Zhao et al. | |
| 6,879,039 | B2 | 4/2005 | Khan et al. | |
| 6,882,042 | B2 | 4/2005 | Zhao et al. | |
| 6,887,741 | B2 | 5/2005 | Zhao et al. | |
| 6,906,414 | B2 | 6/2005 | Zhao et al. | |
| 6,919,630 | B2 | 7/2005 | Hsiao | |
| 6,989,593 | B2 | 1/2006 | Khan et al. | |
| 7,005,737 | B2 | 2/2006 | Zhao et al. | |
| 7,015,072 | B2 | 3/2006 | Combs et al. | |
| 7,026,711 | B2 | 4/2006 | Lee et al. | |
| 7,038,312 | B2 | 5/2006 | Khan et al. | |
| 7,038,315 | B2 * | 5/2006 | King et al. | 257/738 |
| 7,057,277 | B2 | 6/2006 | Chen et al. | |
| 7,061,102 | B2 | 6/2006 | Eghan et al. | |
| 7,067,911 | B1 * | 6/2006 | Lin et al. | 257/686 |
| 7,078,806 | B2 | 7/2006 | Khan et al. | |
| 7,094,060 | B2 | 8/2006 | Zhang | |
| 7,102,225 | B2 | 9/2006 | Khan et al. | 257/706 |
| 7,132,744 | B2 | 11/2006 | Zhao et al. | |
| 7,148,084 | B2 | 12/2006 | Strobel et al. | |
| 7,161,239 | B2 | 1/2007 | Zhao et al. | |
| 7,168,957 | B2 | 1/2007 | Zhang | |
| 7,196,415 | B2 | 3/2007 | Zhong et al. | |
| 7,198,987 | B1 | 4/2007 | Warren et al. | |
| 7,202,559 | B2 | 4/2007 | Zhao et al. | |
| 7,227,256 | B2 | 6/2007 | Zhao et al. | |
| 7,241,645 | B2 | 7/2007 | Zhao et al. | |
| 7,245,008 | B2 * | 7/2007 | Lee | 257/686 |
| 7,245,500 | B2 | 7/2007 | Khan et al. | |
| 7,259,445 | B2 | 8/2007 | Lau et al. | |
| 7,259,448 | B2 | 8/2007 | Zhang et al. | |
| 7,259,457 | B2 | 8/2007 | Zhang et al. | |
| 7,262,080 | B2 * | 8/2007 | Go et al. | 438/109 |
| 7,262,082 | B1 * | 8/2007 | Lin et al. | 438/109 |
| 7,271,024 | B2 * | 9/2007 | Huang et al. | 438/51 |
| 7,271,479 | B2 | 9/2007 | Zhao et al. | |
| 7,276,802 | B2 | 10/2007 | Hall et al. | |
| 7,288,835 | B2 * | 10/2007 | Yim et al. | 257/685 |
| 7,312,108 | B2 | 12/2007 | Zhao et al. | |
| 7,326,061 | B2 | 2/2008 | Zhang | |
| 7,354,800 | B2 * | 4/2008 | Carson | 438/109 |
| 7,372,151 | B1 * | 5/2008 | Fan et al. | 257/738 |
| 7,385,299 | B2 * | 6/2008 | Chow et al. | 257/787 |
| 7,402,906 | B2 | 7/2008 | Rahman Khan et al. | |
| 7,411,281 | B2 | 8/2008 | Zhang | |
| 7,432,586 | B2 | 10/2008 | ZHAO et al. | |
| 2001/0042913 | A1 * | 11/2001 | Fukuda et al. | 257/697 |
| 2002/0024137 | A1 | 2/2002 | Olofsson et al. | |
| 2002/0066947 | A1 * | 6/2002 | Yu et al. | 257/678 |
| 2002/0079572 | A1 | 6/2002 | Khan et al. | |
| 2002/0190361 | A1 | 12/2002 | Zhao et al. | |
| 2002/0190396 | A1 * | 12/2002 | Brand | 257/787 |
| 2003/0057550 | A1 | 3/2003 | Zhao et al. | |
| 2003/0111728 | A1 | 6/2003 | Thai et al. | |
| 2003/0146509 | A1 | 8/2003 | Zhao et al. | |
| 2003/0155648 | A1 * | 8/2003 | Lo et al. | 257/723 |
| 2003/0170933 | A1 * | 9/2003 | Manansala | 438/116 |
| 2003/0178719 | A1 | 9/2003 | Combs et al. | |
| 2004/0038447 | A1 | 2/2004 | Corisis et al. | |
| 2004/0084771 | A1 | 5/2004 | Bolken et al. | |
| 2004/0145039 | A1 * | 7/2004 | Shim et al. | 257/678 |
| 2004/0178499 | A1 | 9/2004 | Mistry et al. | |
| 2004/0183174 | A1 * | 9/2004 | Huang et al. | 257/678 |
| 2005/0029657 | A1 | 2/2005 | Khan et al. | |
| 2005/0035452 | A1 | 2/2005 | Zhang et al. | |
| 2005/0077545 | A1 | 4/2005 | Zhao et al. | |
| 2005/0127501 | A1 | 6/2005 | Khan et al. | |
| 2005/0280127 | A1 | 12/2005 | Zhao et al. | |
| 2005/0280139 | A1 | 12/2005 | Zhao et al. | |
| 2005/0280141 | A1 | 12/2005 | Zhang | |
| 2006/0006534 | A1 * | 1/2006 | Yean et al. | 257/737 |
| 2006/0012037 | A1 | 1/2006 | Raedt et al. | |
| 2006/0065972 | A1 | 3/2006 | Khan et al. | |
| 2006/0091542 | A1 | 5/2006 | Zhao et al. | |
| 2006/0166397 | A1 | 7/2006 | Lau et al. | |
| 2007/0007644 | A1 | 1/2007 | Zhao et al. | |
| 2007/0040267 | A1 | 2/2007 | Zhao et al. | |
| 2007/0045824 | A1 | 3/2007 | Zhao et al. | |
| 2007/0090502 | A1 | 4/2007 | Zhao et al. | |
| 2007/0108598 | A1 | 5/2007 | Zhong et al. | |
| 2007/0158806 | A1 * | 7/2007 | Kwon et al. | 257/686 |
| 2007/0200210 | A1 | 8/2007 | Zhao et al. | |
| 2007/0267734 | A1 | 11/2007 | Zhao et al. | |
| 2007/0267740 | A1 | 11/2007 | Zhao et al. | |
| 2007/0273023 | A1 | 11/2007 | Zhao et al. | |
| 2007/0278632 | A1 | 12/2007 | Zhao et al. | |
| 2007/0290322 | A1 | 12/2007 | Zhao et al. | |
| 2007/0290376 | A1 | 12/2007 | Zhao et al. | |
| 2008/0006934 | A1 | 1/2008 | Zhao et al. | |
| 2008/0096312 | A1 | 4/2008 | Law et al. | |
| 2008/0105973 | A1 | 5/2008 | Zhang | |
| 2008/0182364 | A1 | 7/2008 | Zhang | |
| 2008/0211089 | A1 | 9/2008 | Khan et al. | |

OTHER PUBLICATIONS

Babinetz, Stephen, "Wire Bonding Solutions for 3-D Stacked Die Packages", Kulicke & Soffa Industries, as published in Electronics Manufacturing Engineering, Q3, 2003, pp. 1-10.

Carson et al. "Advances in Stacked-Die Packaging", ChipPAC Inc., 2002, pp. 7-13.

"TAPP™ Thin Array Plastic Package", ASAT Peak Performance, retrieved from the internet on Oct. 27, 2006, http://www.asat.com/products/leadless/tapp.php, pp. 1-5.

"ASAT's Fine-Pitch Ball Grid Array", ASAT Peak Performance, retrieved from the internet on Oct. 27, 2006, http://www.asat.com/index.php, pp. 1-2.

"Stacked Die", ASAT Peak Performance, retrieved from the internet on Oct. 27, 2006, http://www.asat.com/products/sip/stacked.phP, p. 1.

"PBGA Plastic Ball Grid Array", ASAT Peak Performance, retrieved from the internet on Oct. 27, 2006, http://www.asat.com/products/array/pbga.php, pp. 1-2.

Freyman et al., "Overmolded Plastic Pad Array Carriers (OMPAC): A low Cost, High Interconnect Density IC Packaging Solution for Consumer and Industrial Electronics", Electronic Components and Technology Conference, IEEE, 1991, pp. 176-182.

Search Report for European Application No. EP 07 00 8564 completed on Sep. 10, 2007, 3 pages.

English Abstract of CN1753178, publication date of Mar. 29, 2006.

Harper, Charles A., "Packaging and Interconnection of Integrated Circuits," Electronic Packaging and Interconnection Handbook, $3^{rd}$ Edition, pp. 7.61-7.67, McGraw-Hill, USA, copyright 2000.

Office Action as Mailed on Mar. 5, 2009 and cited in U.S. Appl. No. 11/589,120, filed Oct. 30, 2006.

John H. Lau, "Ball Grid Array Technology", McGraw-Hill, Inc., 1995.

The Final Office Action as Mailed on Sep. 1, 2009 and cited in U.S. Appl. No. 11/589,120, with a filing date Oct. 30, 2006.

* cited by examiner

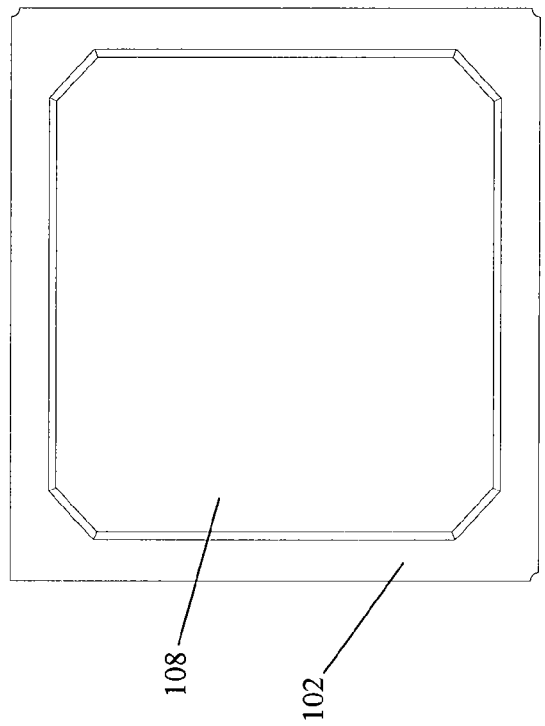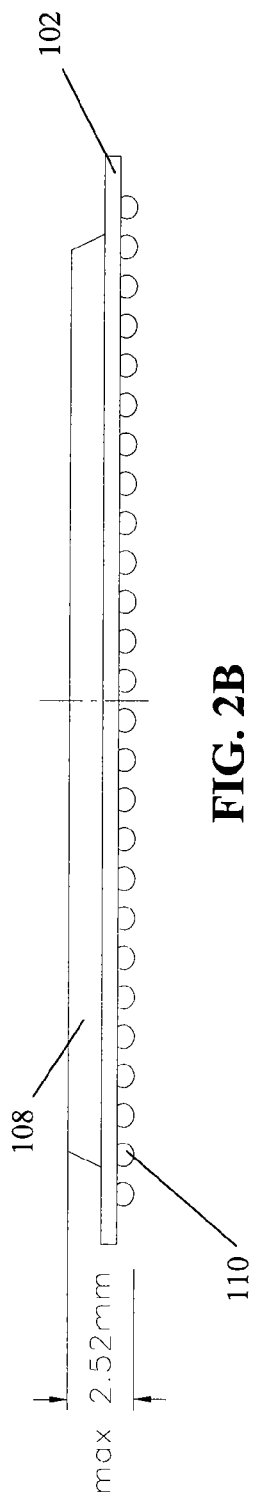
FIG. 2A
Prior Art
FIG. 2B
Prior Art

INTERCONNECT STRUCTURE AND FORMATION FOR PACKAGE STACKING OF MOLDED PLASTIC AREA ARRAY PACKAGE

This application claims the benefit of U.S. Prov. Appl. No. 60/799,657, filed May 12, 2006, which is incorporated by reference herein in its entirety.

BACKGROUND OF THE INVENTION

1. Field of the Invention

The present invention relates to integrated circuit (IC) device packaging technology. More specifically, the invention relates to stacked packages.

2. Related Art

The die-up plastic ball grid array package was first introduced by Motorola and was called Overmolded Plastic Pad Array Carriers (OMPAC). For further detail on this package type, refer to "Overmolded Plastic Pad Array Carriers (OMPAC): A Low Cost, High Interconnect Density IC Packaging Solution for Consumer and Industrial Electronics," Electronic Components and Technology Conference, IEEE, pp. 176-182, 1991, which is incorporated by reference herein in its entirety. Commonly known as a "PBGA" package, the plastic ball grid array (PBGA) package features a plastic printed circuit board (substrate) typically made of Bismaleimide Triazine (BT) resins or FR4 materials.

Conventional ball grid array (BGA) packages do not allow for interconnection between stacked packages through the encapsulating material. Thus, what is needed is an IC package that allows for interconnection through the encapsulating material.

SUMMARY OF THE INVENTION

Apparatuses, methods, and systems for improved integrated circuit packages are described. An integrated circuit (IC) package includes a substrate having opposing first and second surfaces, an IC die, and an encapsulating material. The substrate has a plurality of contact pads on the first surface that are electrically coupled to a plurality of electrically conductive features on the second surface. A plurality of conductive elements is formed on the plurality of contact pads on the first surface of the substrate. The IC die is located on the first surface of the substrate. The encapsulating material encapsulates the IC die and a portion of each element of the plurality of conductive elements.

BRIEF DESCRIPTION OF THE FIGURES

The accompanying drawings, which are incorporated herein and form a part of the specification, illustrate the embodiments of the present invention and, together with the description, further serve to explain the principles of the embodiments and to enable a person skilled in the pertinent art to make and use the invention.

FIGS. 2A and 2B show top and side views, respectively, of an outline drawing of a PBGA package.

Figure 1:
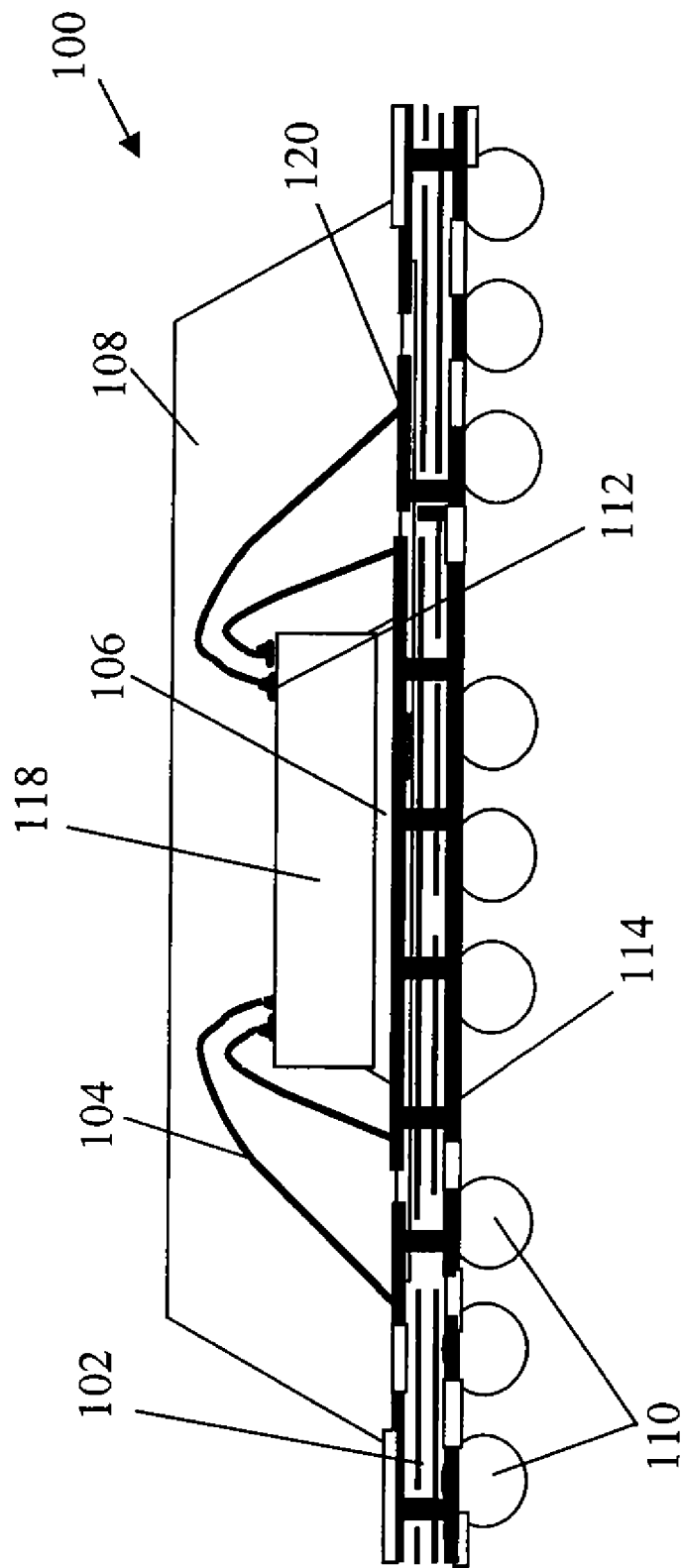
FIG. 1 shows a conventional plastic ball grid array (PBGA) package.

The embodiments of the present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present specification discloses one or more embodiments that incorporate the features of the invention. The disclosed embodiments merely exemplify the invention. The scope of the invention is not limited to the disclosed embodiments. The invention is defined by the claims appended hereto.

Furthermore, it should be understood that spatial descriptions (e.g., "above", "below", "left", "right", "up", "down", "top", "bottom", etc.) used herein are for purposes of illustration only, and that practical implementations of the structures described herein can be spatially arranged in any orientation or manner.

Overview

The invention described herein provides a methodology and apparatus for forming an IC package including a substrate having opposing first and second surfaces, an IC die, and an encapsulating material. The substrate has a plurality of contact pads on the first surface that are electrically coupled to a plurality of electrically conductive features on the second surface. A plurality of conductive elements is formed on the plurality of contact pads on the first surface of the substrate. The IC die is located on the first surface of the substrate. The encapsulating material encapsulates the IC die and a portion of each element of the plurality of conductive elements.

A portion of each element of the plurality of conductive elements is left exposed (e.g., not encapsulated by the encapsulating material). The exposed portions form a plurality of contact pads which may be coupled to a device. The device may be another package, a circuit element, etc. The IC package may be a variety of different packages such as a ball grid array (BGA), fine pitch ball grid array (FBGA), or a pin grid array (PGA).

Integrated Circuit Package Technology

A ball grid array (BGA) package is used to package and interface an IC die with a circuit board such as a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., Ball Grid Array Technology, McGraw-Hill, New York, (1995), which is herein incorporated by reference in its entirety.

FIG. 1 shows a conventional plastic ball grid array (PBGA) package 100. As shown in FIG. 1, PBGA package 100 includes a substrate 102, an IC die 118, wirebonds 104, solder balls 110, contact pads 114, bond fingers 120, bond pads 112, and an encapsulating material 108. IC die 118 is attached to a first surface of substrate 102 using an adhesive 106. Wirebonds 104 couple bond pads 112 on IC die 118 to bond fingers 120 on the first surface of substrate 102. Solder balls 110 are electrically coupled to contact pads 114 on a second surface of substrate 102. Encapsulating material 108 encapsulates IC die 118, wirebonds 104, and a portion of the first surface of substrate 102, for environmental protection. A periphery of the first surface of substrate 102 around encapsulating material 108 is exposed (e.g., not covered by encapsulating material 108).

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex").

FIGS. 2A and 2B show outline drawings of top and side views respectively of a conventional PBGA package 200 including an encapsulating material 108, a substrate 102 and a plurality of solder balls 110. As shown in both FIGS. 2A and 2B, encapsulating material 108 does not completely cover the top surface of substrate 102.

Figure 3A:
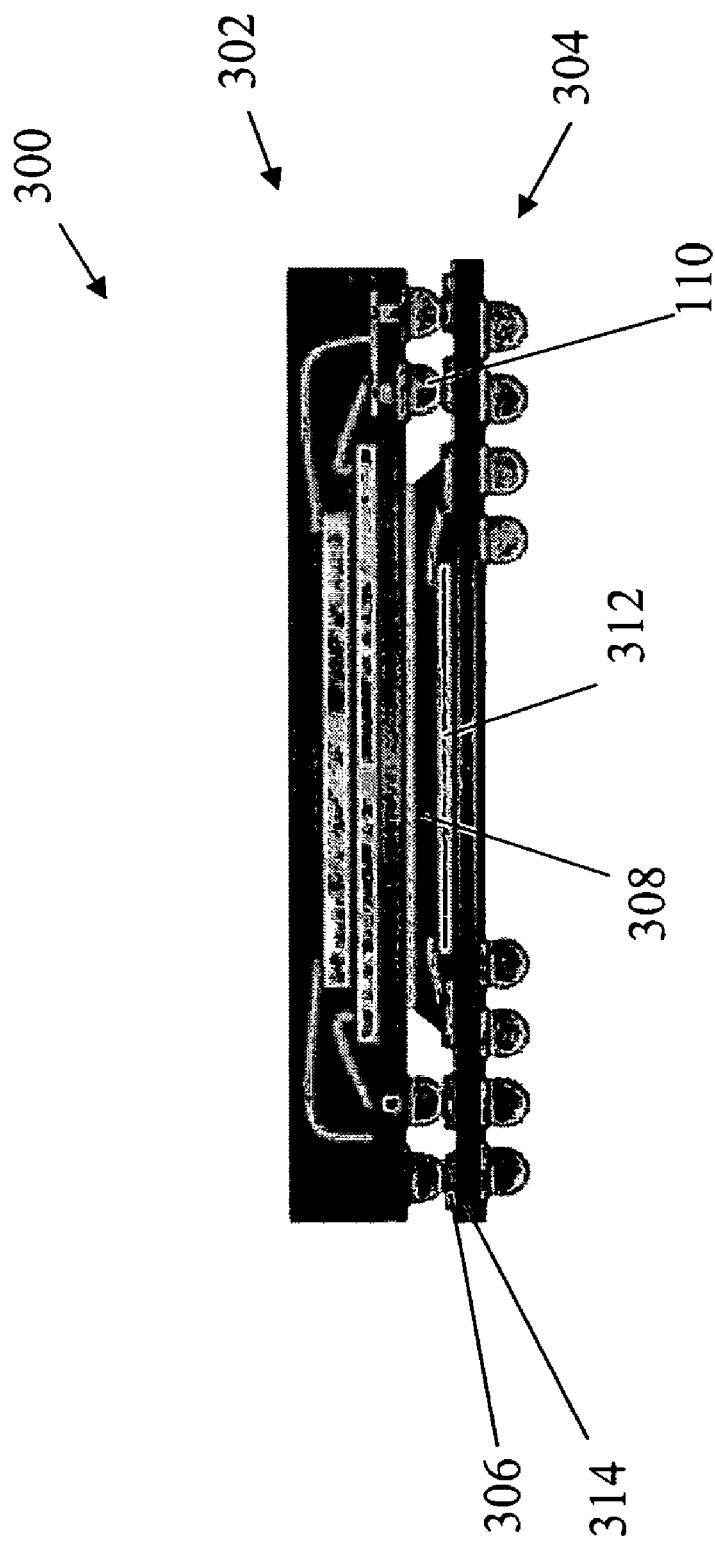
FIGS. 3A and 3B show examples of stacked packages.

FIG. 3A shows a stacked BGA package 300 including a BGA package 302 stacked on another BGA package 304. Package 304 includes a plurality of solder ball land pads 306, an encapsulating material 308, an IC die 312, and a substrate 314.

Package 302 is electrically coupled to package 304 through a plurality of solder balls 110 that contact exposed solder ball land pads 306 on bottom BGA package 304. Exposed solder ball land pads 306 of package 304 are located along a periphery of a top surface of substrate 314 and surround encapsulating material 308. For further detail on package 300, refer to "Implement Stacked Package-on-Package Designs," Electronic Engineering Times, 2005, by Dreiza et al, which is incorporated by reference herein in its entirety.

Figure 3B:
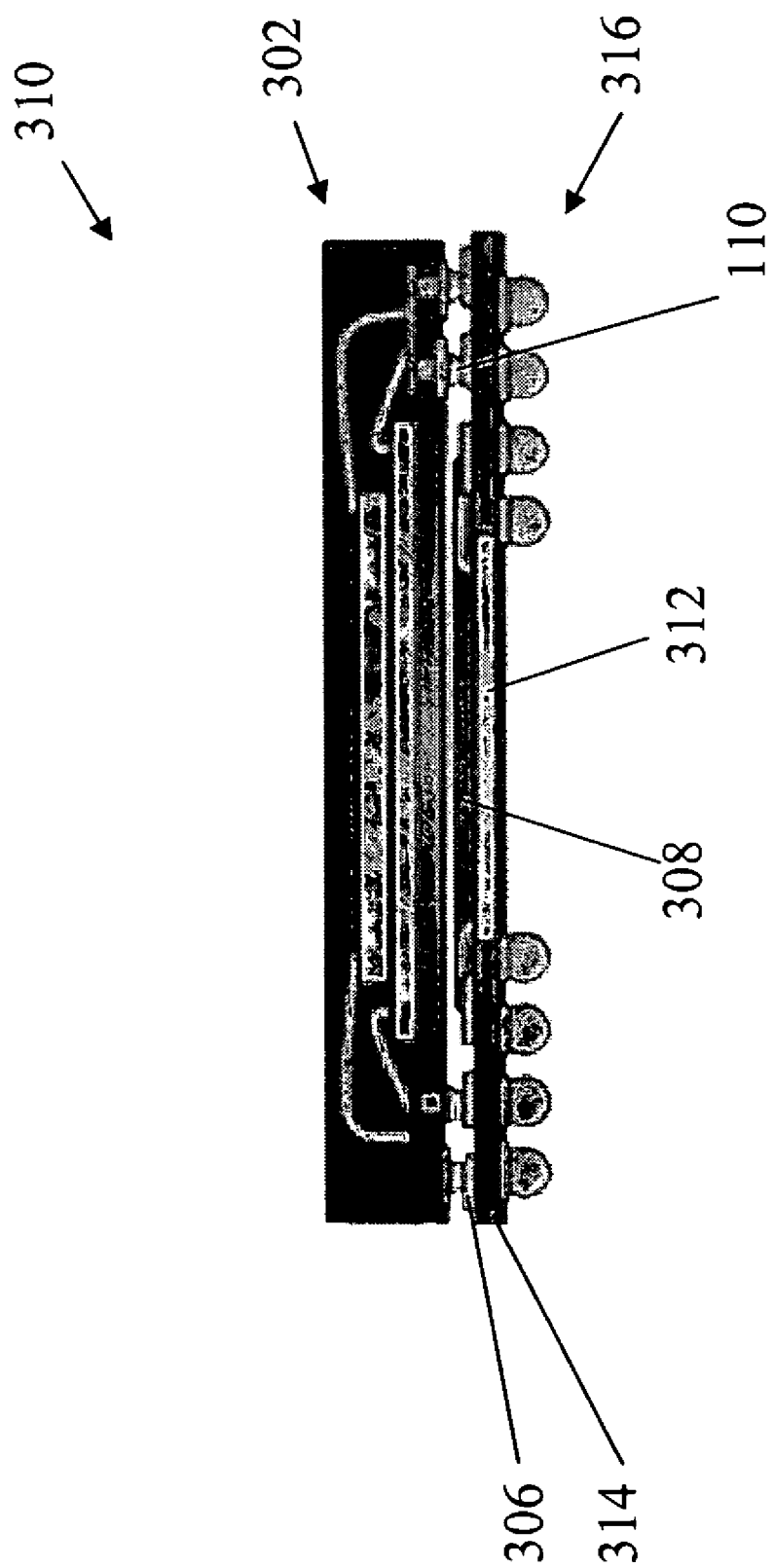

FIG. 3B shows a similar stacked package 310, with some differences described as follows. In package 310, a bottom BGA package 316 has IC die 312 placed inside of a window in the substrate 314 thereby reducing the height of the overall package. The packages in FIGS. 3A and 3B can be attached using conventional reflow surface mount processes.

Because the solder ball land pads on the bottom package substrate top must be exposed to allow for the stacking of a top package, the IC die of the bottom package must be encapsulated within an encapsulation cavity (e.g. a mold cap) to define the extent of the encapsulating material and to prevent the encapsulating material from covering or contaminating solder ball land pads 306. Since the size of the encapsulating material is limited, the size of the IC die contained within the encapsulating material must also be limited. This requirement to partially expose the top surface of the substrate for package-to-package interconnection limits the bottom package to a PBGA package similar to package 100 and package 200 shown in FIGS. 1 and 2, respectively, or a package with similar features to package 304 and 316 shown in FIGS. 3A and 3B, respectively. To minimize stress resulting from a mismatch between the top and bottom packages, the top package 302 is also often limited to transfer molded BGA packages such as PBGA packages.

Figure 4:
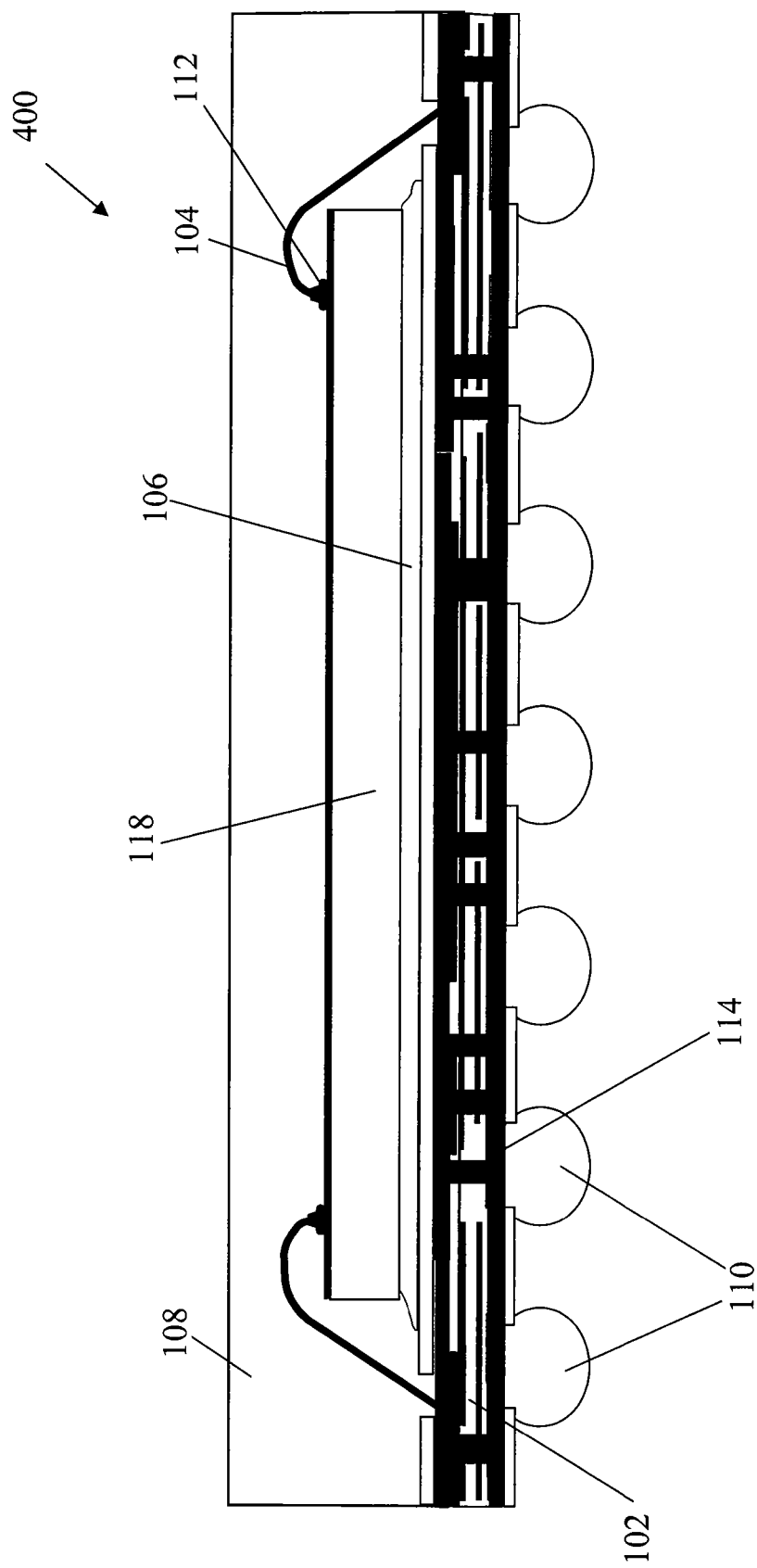
FIG. 4 shows a conventional fine pitch ball grid array (FBGA) package.

FIG. 4 shows a cross-sectional view of a conventional fine pitch BGA (FBGA) package 400 including a substrate 102, wirebonds 104, a plurality of solder balls 110, an IC die 118, and an encapsulating material 108. Encapsulating material 108 encapsulates a first (e.g., top) surface of substrate 102 along with IC die 118 and wirebonds 104. Since encapsulating material 108 completely encapsulates the first surface of substrate 102, a plurality of contact pads similar to those shown in package 304 and 316 cannot be placed on a periphery of package 400. Thus, package 400 is limited to being a top package, if a stacking strategy shown in FIGS. 3A and 3B is used.

The stacking of a package on top of another package requires electrical interconnection between the external terminals of top and bottom packages. Overmolded area array packages such as FBGA and LGA packages do not have electrical signal interconnect terminals on their package top surfaces. The same problem exists for certain types of leadframe packages such as no-lead quad flat packages (QFN, also known as MLP, MLF, and LPCC packages) as well as TAPP packages (e.g., see www.asat.com). Consequently, these packages cannot have other packages stacked on their top.

Embodiments of the present invention overcome the limitations described above. Example embodiments of the present invention are described in detail below.

Further details of structural and operational implementations of stacked packages of the present invention are described in the following sections. These structural and operational implementations are described herein for illustrative purposes, and are not limiting. For instance, the present invention as described herein may be implemented in other IC package types, including land grid array (LGA), pin grid array (PGA), and fine pitch ball grid array (FBGA) packages, including any of the BGA packages described above. Furthermore, each of the embodiments presented below are applicable to flex tape substrate packages, plastic substrate packages, ceramic substrate packages, and other substrate types. The description below is adaptable to these and other package types, as would be understood to persons skilled in the relevant art(s) from the teachings herein.

Features of each of the embodiments presented below may be incorporated into stacked packages independently, or may be combined in any manner with the other features described herein, as would be apparent to persons skilled in the relevant art(s) from the teachings herein.

Figure 5A:
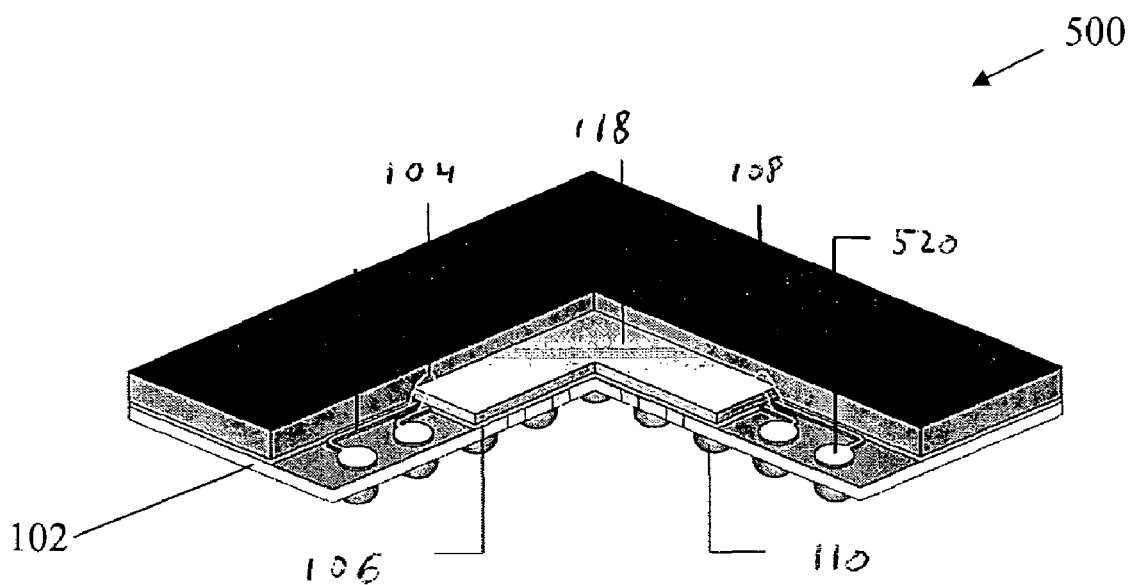
FIGS. 5A-5C show the basic steps for assembling an IC package, according to embodiments of the present invention.
Figure 5B:
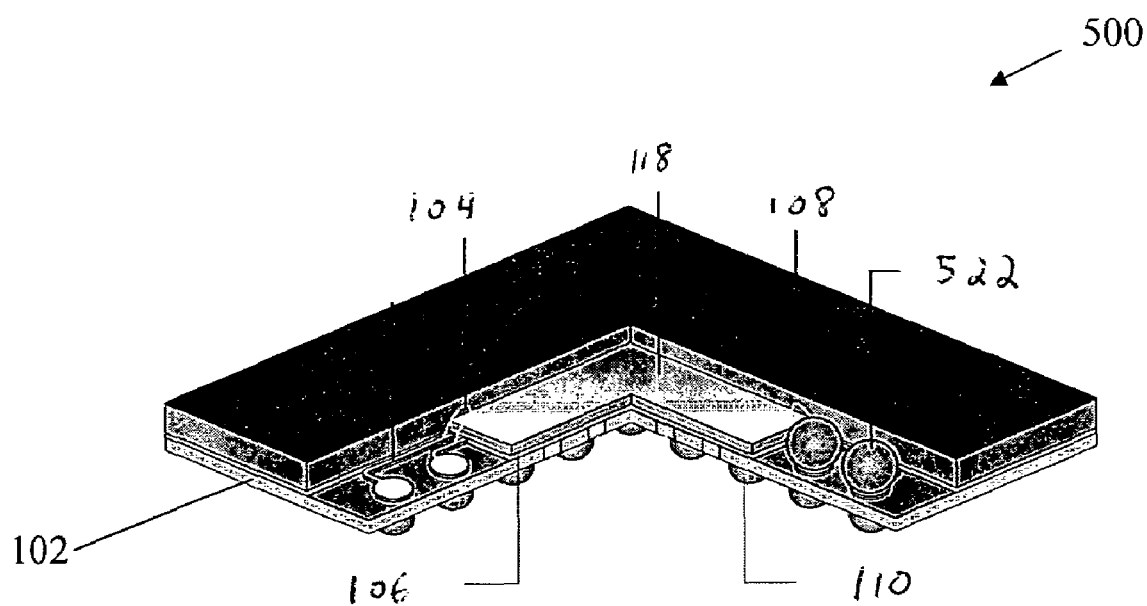
Figure 5C:
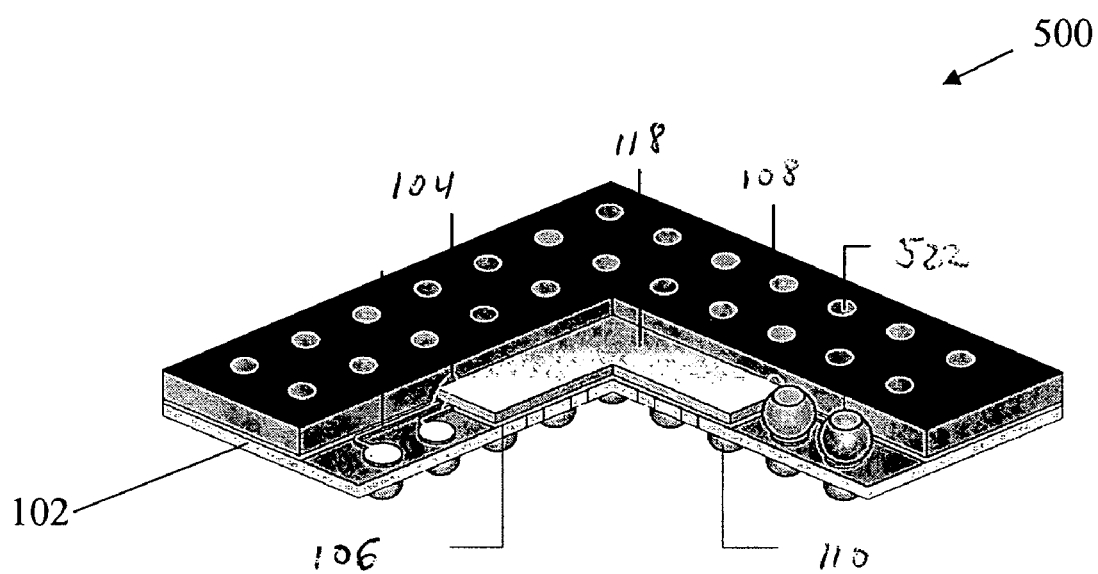

FIGS. 5A-5C show an embodiment of the present invention using solder ball pads and solder balls to provide an interconnection structure for package stacking, but as would be understood by someone skilled in the art, conductive elements of a variety of shapes may also be coupled to contact pads 520 to allow for the electrical interconnection.

FIG. 5A shows a die-up BGA package 500, according to an embodiment of the present invention. Package 500 includes substrate 102, IC die 118, a plurality of solder balls 110, encapsulating material 108, wirebonds 104, adhesive 106 and a plurality of solder ball pads 520.

Substrate 102 can be organic (BT, FR4, etc.), ceramic, glass, tape, and/or made from other dielectric materials. Furthermore, substrate 102 may have one or more conductive layers, including features such as contact pads, bond fingers, traces, conductive planes, etc., for transmission of electrical signals, attachment of wirebonds, solder balls, etc., to enhance mounting of electrical components, for power/ground planes, etc. Vias or other electrically conductive features may be used to electrically couple conductive features through substrate 102.

Solder ball pads 520 are attached to a first (e.g., top) surface of substrate 102 as shown in FIG. 5A. Solder ball pads 520 are electrically connected to a plurality of contact pads (not shown) on a second (e.g., bottom) surface of substrate 102.

FIG. 5B shows package 500 with a second plurality of solder balls 522 mounted on solder ball pads 520. Once solder balls 522 are mounted on solder ball pads 520, the first surface of substrate 102 is encapsulated in an encapsulating material 108. If a height of solder balls 522 relative to the first surface of substrate 102 is equal to or exceeds a height of a first (e.g., top) surface of encapsulating material 108 relative to the first surface of substrate 102, a portion of each solder ball of the plurality of solder balls 522 may be exposed (e.g. not covered by encapsulating material 108).

FIG. 5C shows package 500 after a layer of encapsulating material 108 is removed. When the layer of the encapsulating material 108 is removed, a portion of each of the second plurality of solder balls 522 is exposed and truncated. As FIG. 5C shows, after the layer of the encapsulation material is removed, the plurality of truncated solder balls is exposed and forms a plurality of contact pads so a device can be mounted on top of package 500. In an alternate embodiment, the layer of encapsulating material is removed such that a portion of each solder ball of plurality of solder balls 522 is exposed, but not truncated.

Exposed solder balls 522 on the package mold top can be used for electrical interconnections such as package stacking to form a package on package (PoP) stack. Multiple electronic components, including packages, inductors, capacitors, and resistors can also be attached to the top surface of encapsulating material 108.

There are various different shaped portions of encapsulating material that can be removed to expose and truncate a plurality of conductive elements to create a plurality of contact pads used for interconnection.

Figure 6A:
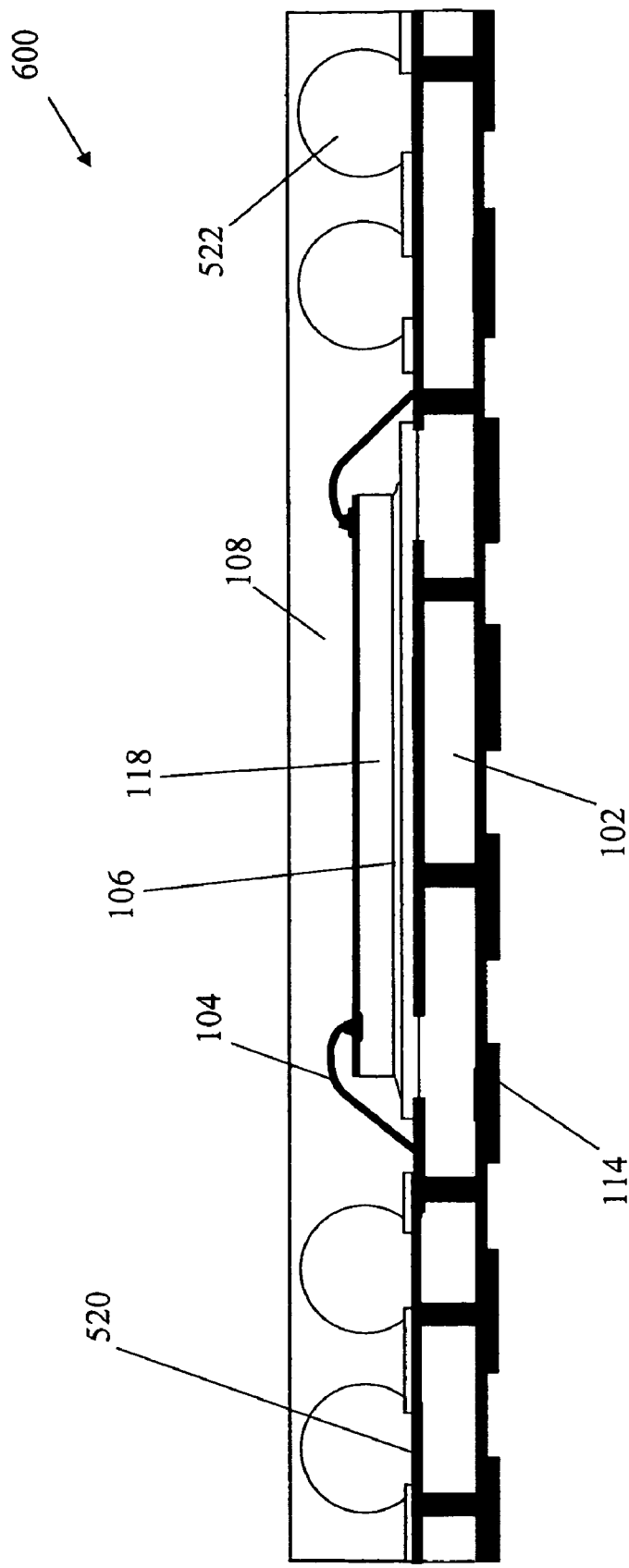
FIGS. 6A-6E show methods for exposing conductive elements by removing a portion of the encapsulating material.

FIG. 6A shows a cross-sectional view of a package 600 according to an embodiment of the present invention. Package 600 includes substrate 102, IC die 118, wirebonds 104, a plurality of solder ball pads 520, a plurality of solder balls 522 and encapsulating material 108. Encapsulating material 108 encapsulates solder balls 522, IC die 118 and wirebonds 104. Package 600 has solder balls 522 completely encapsulated in encapsulating material 108, but a portion of the encapsulating material 108 has not yet been removed to expose a portion of each solder ball of plurality of solder balls 522.

Figure 6B:
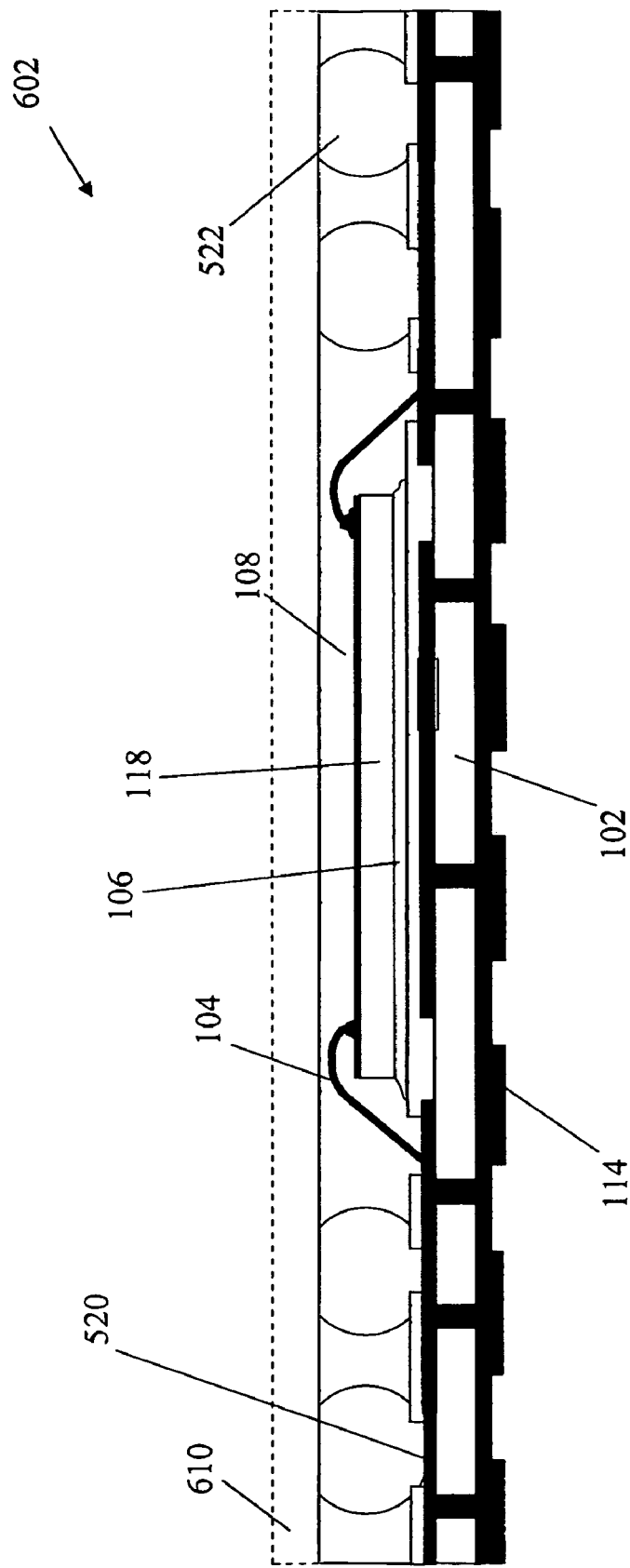

FIG. 6B shows a package 602. In this embodiment, package 602 is substantially similar to package 600. However in package 602, a planar layer 610 of encapsulating material 108 is removed to expose and truncate solder balls 522. Removing layer 610 results in the reduction of an overall height of package. Moreover, portions of each of the plurality of solder balls 522 are exposed to serve as contact pads that allow for electrical interconnection with electrical components and/or packages on a first (e.g., top) surface of encapsulating material 108.

Figure 6C:
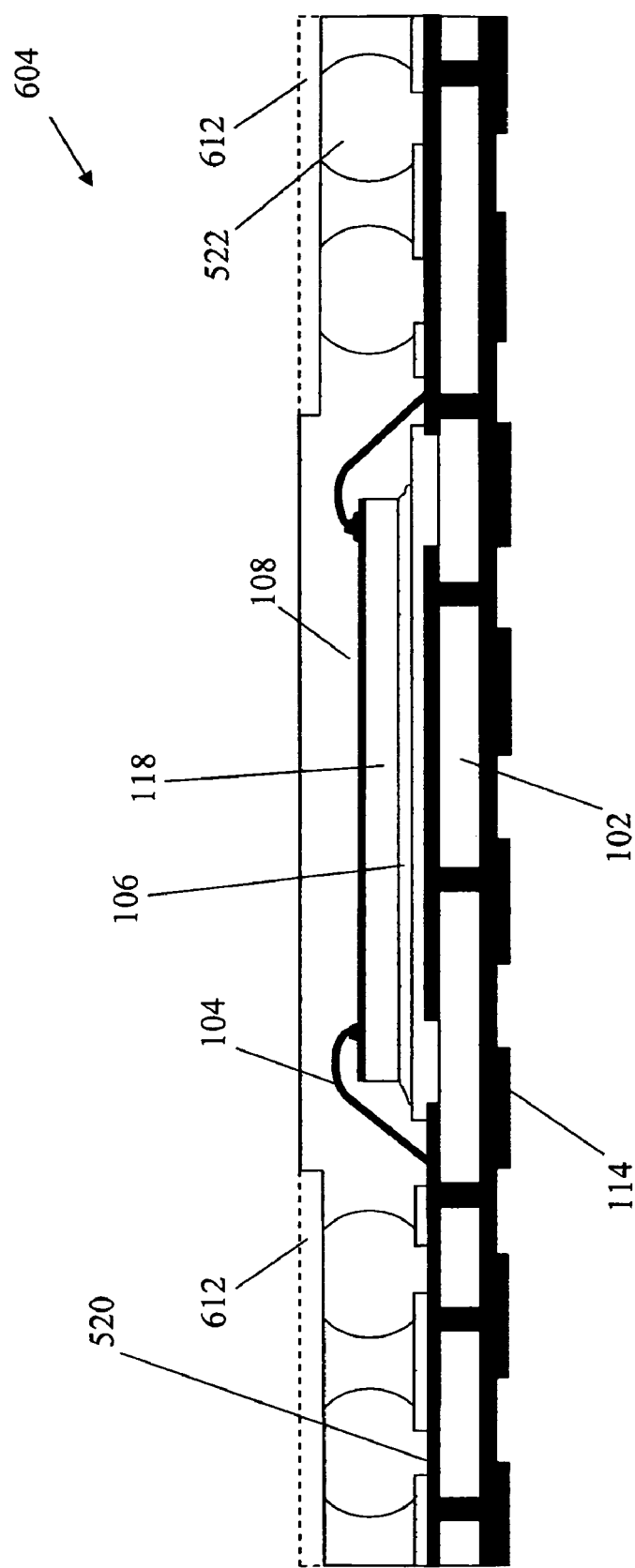

FIG. 6C shows a package 604. Package 604 is substantially similar to package 602 except that instead of removing a planar region of the encapsulating material as in FIG. 6B, a portion 612 of encapsulating material 108 is removed along a periphery of the first surface of encapsulating material to create a shelf in encapsulating material 108. As a result, solder balls 522 are truncated and exposed to allow for contact with electrical components and/or packages on the first surface of encapsulating material 108.

Figure 6D:
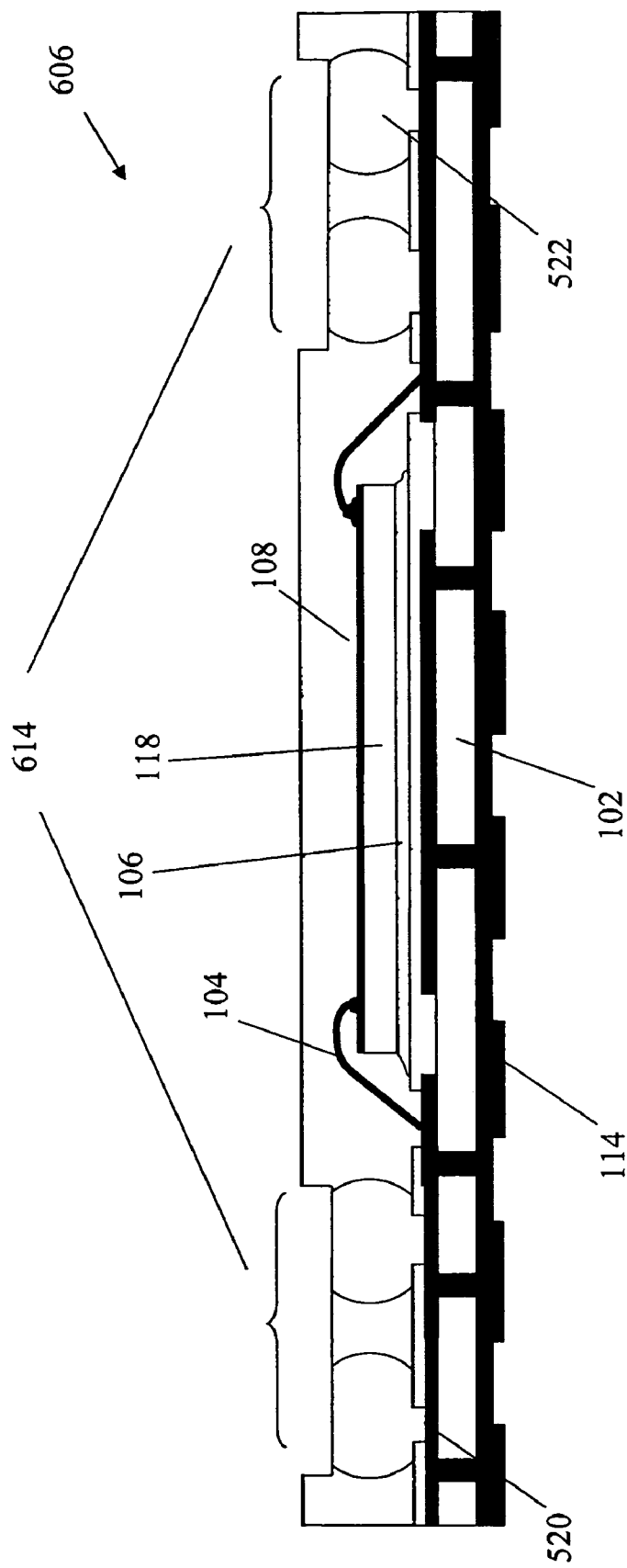

FIG. 6D shows a package 606. Package 606 in FIG. 6D is substantially similar to package 604 in FIG. 6C. However instead of removing encapsulating material 108 along the periphery of the first surface of the encapsulating material 108, a trench 614 is formed in encapsulating material 108 in a rectangular ring around IC die 118 that truncates and exposes solder balls 522 and allows for contact with electrical components and/or packages on the first surface of encapsulating material 108.

Figure 6E:
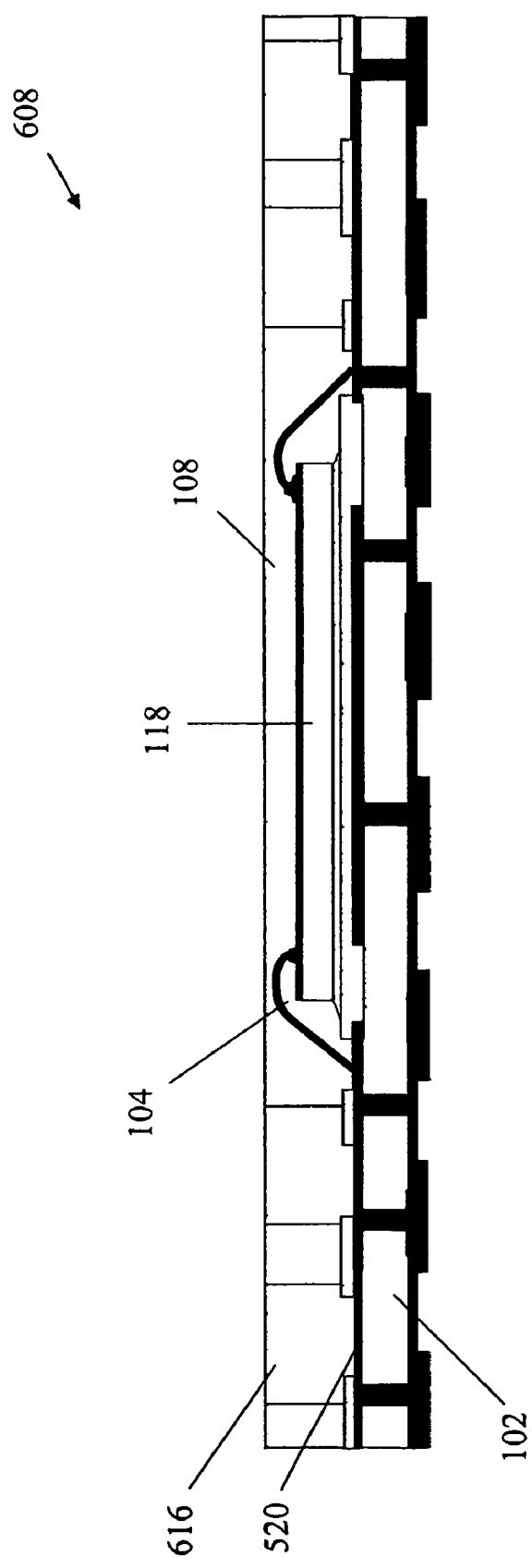

FIG. 6E shows package 608. Package 608 is substantially similar to package 602 in FIG. 6B, however instead of using a plurality of solder balls to allow for the vertical interconnections, a plurality of metallic posts 616 are used to allow for electrical interconnections. FIG. 6E shows an embodiment in which a planar portion of encapsulation material 108 is removed to expose the metallic posts similar to package 602, but as would be understood by someone skilled in the art, any of the options detailed in packages 604 or 606 may also be used to expose metallic posts 616.

Figure 7A:
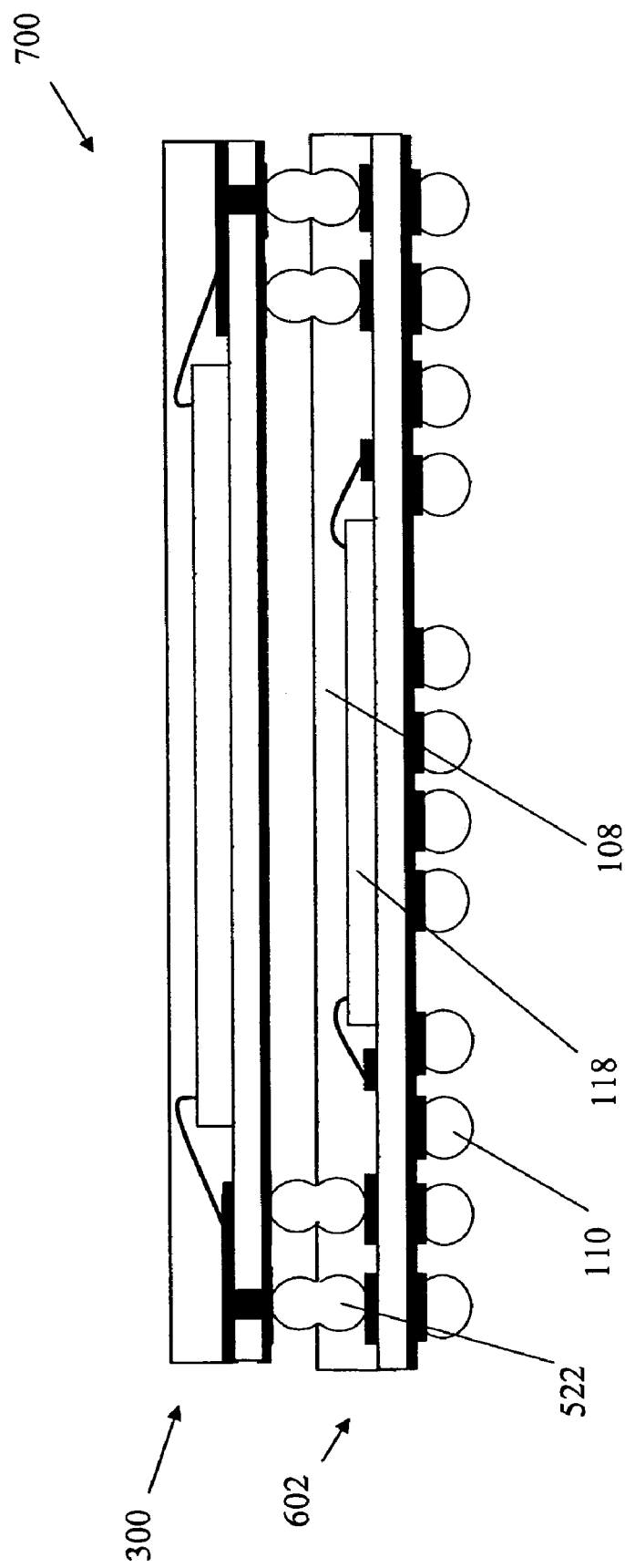
FIGS. 7A-7C show how methods shown in FIGS. 6A-6D can be used to form stacked packages.
Figure 7B:
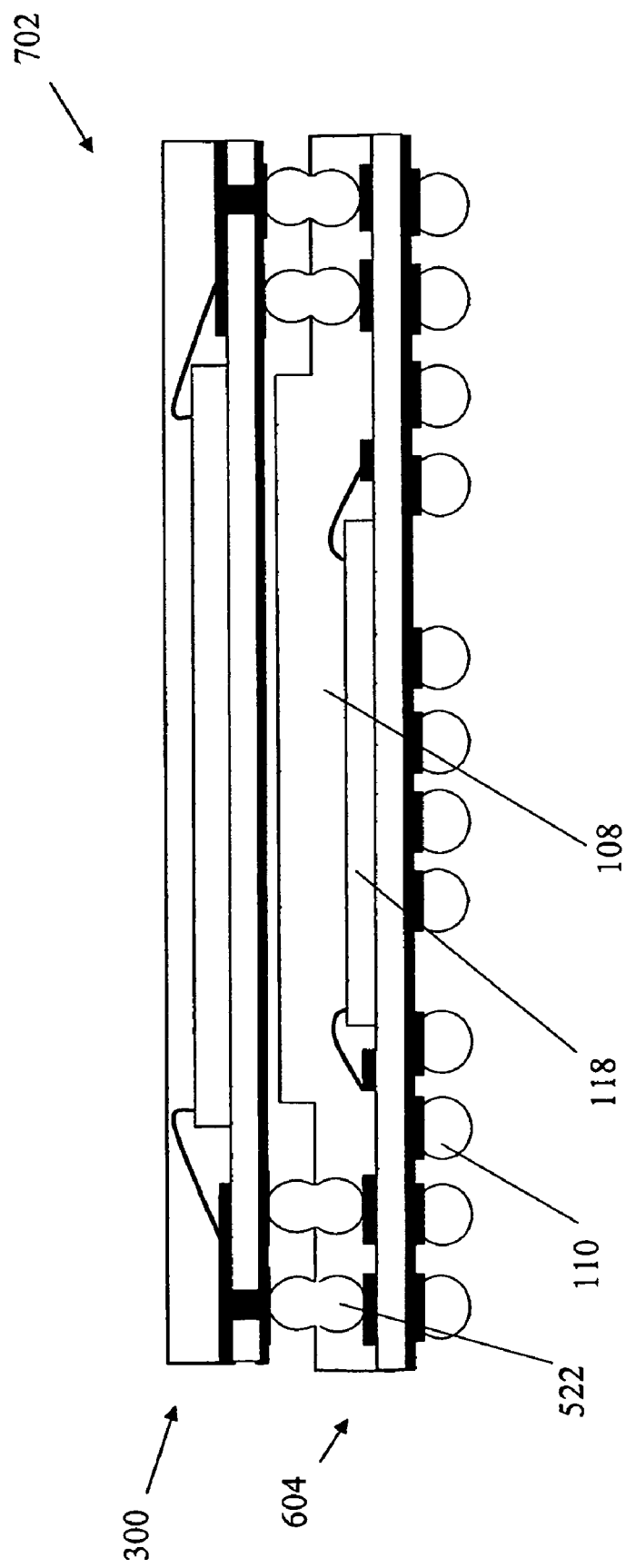
Figure 7C:
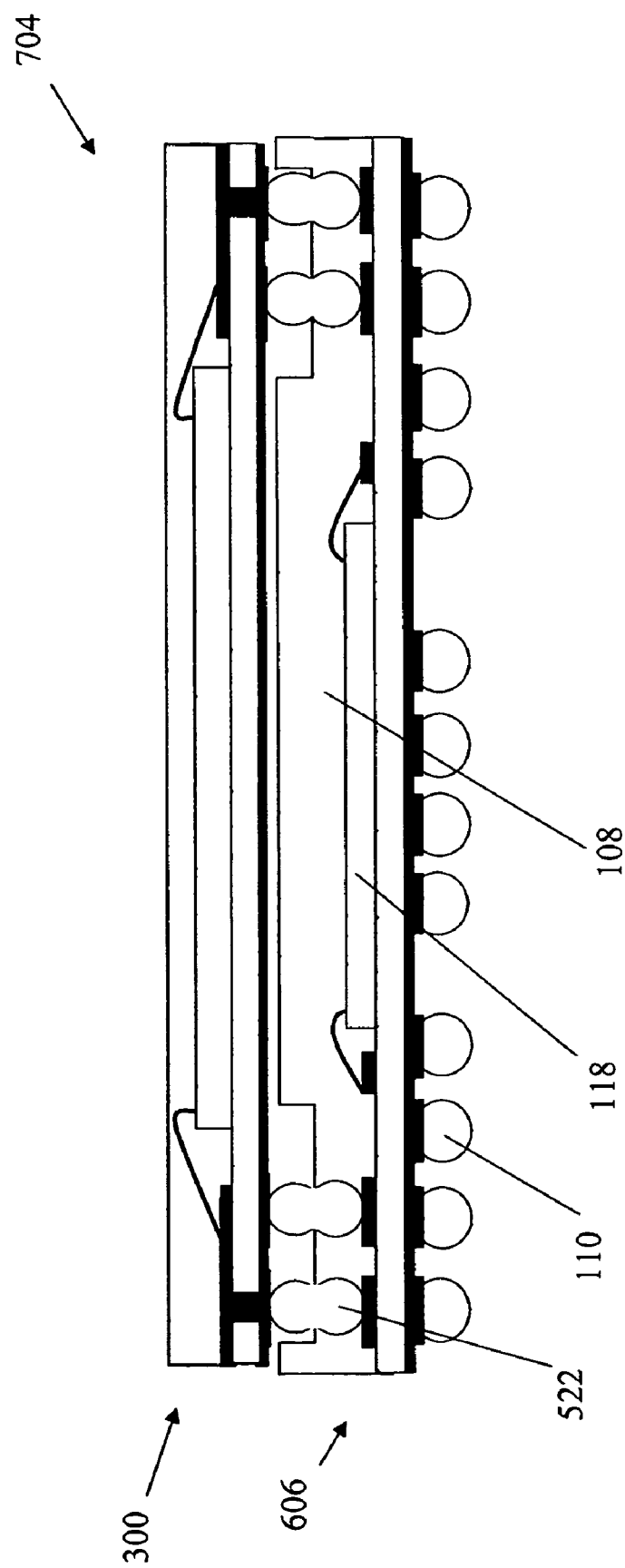

FIGS. 7A-7C shows stacked packages, according to embodiments of the present invention. Package 700 of FIG. 7A includes FBGA package 300 stacked on top of FBGA package 602 as was shown in FIG. 6B. FBGA package 602 includes IC die 118, plurality of solder balls 522, encapsulating material 108 and second plurality of solder balls 110. In FIG. 7A, conventional FBGA package 300 is stacked on top of FBGA package 602 which has exposed and truncated solder balls 522 as a result of removing a planar portion of mold encapsulation layer 108 as shown in FIG. 6B and discussed above.

FIG. 7B shows package 702 in which FBGA package 300 is stacked on top of FBGA package 604, according to an embodiment of the present invention. In FBGA package 604 solder balls 522 are truncated and exposed by removing encapsulating material 108 along a periphery of a top surface of encapsulating material 108 to expose a shelf in the encapsulation material top as shown in FIG. 6C and discussed above.

FIG. 7C shows another package 704 where FBGA package 300 is stacked on top of FBGA package 606. In FBGA package 606 solder balls 522 are truncated and exposed by forming a trench in the top surface of encapsulating material 108 as shown FIG. 6D and discussed above. Embodiments shown in FIGS. 7A-7C include FBGA package 300. However in alternate embodiments, other devices such as other packages and/or electrical components may also be the top package in the stacked package. Moreover, top and bottom packages in a package stack can also be different sizes. Package to package interconnections can be made after solder reflow.

FIGS. 7A-7C illustrate package-to-package interconnection using solder balls on the top surface of the substrate in the bottom package, but as understood by someone skilled in the art, the interconnection could be facilitated by conductive features of a variety of shapes, including metallic posts as shown in package 608 in FIG. 6E.

Although the abovementioned packages have all shown IC dies in a die-up configuration, the stacked packages as described herein may also be applied to die-down packages as well.

Figure 8:
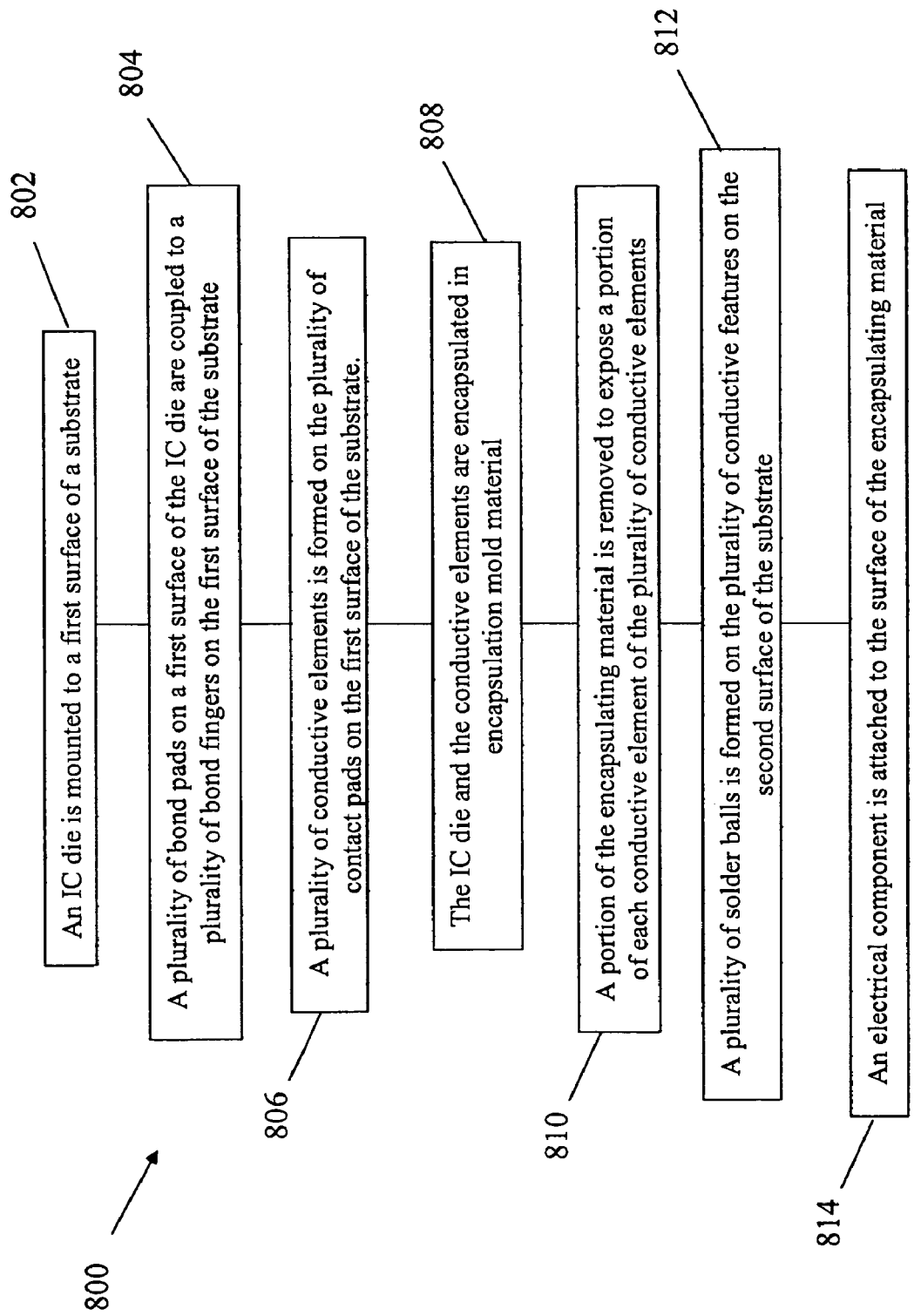
FIG. 8 shows a flowchart of the assembly steps for a stacked IC package, according to an example embodiment of the present invention.

FIG. 8 shows a flowchart 800 providing example steps for assembling stacked IC packages. Other structural and operational embodiments will be apparent to persons skilled in the relevant art(s) based on the following discussion. The steps shown in FIG. 8 do not necessarily have to occur in the order shown. The steps of FIG. 8 are described in detail below. FIGS. 9A-9J illustrate assembly stages in a process for assembling an embodiment of this invention according to flowchart 800, and are referred to in the description below regarding flowchart 800, for illustrative purposes.

Flowchart 800 begins in step 802. In step 802, an IC die is mounted to a first surface of a substrate. The substrate has a plurality of contact pads on a first surface that are electrically connected through the substrate to a plurality of electrically conductive features on a second surface.

Figure 9A:
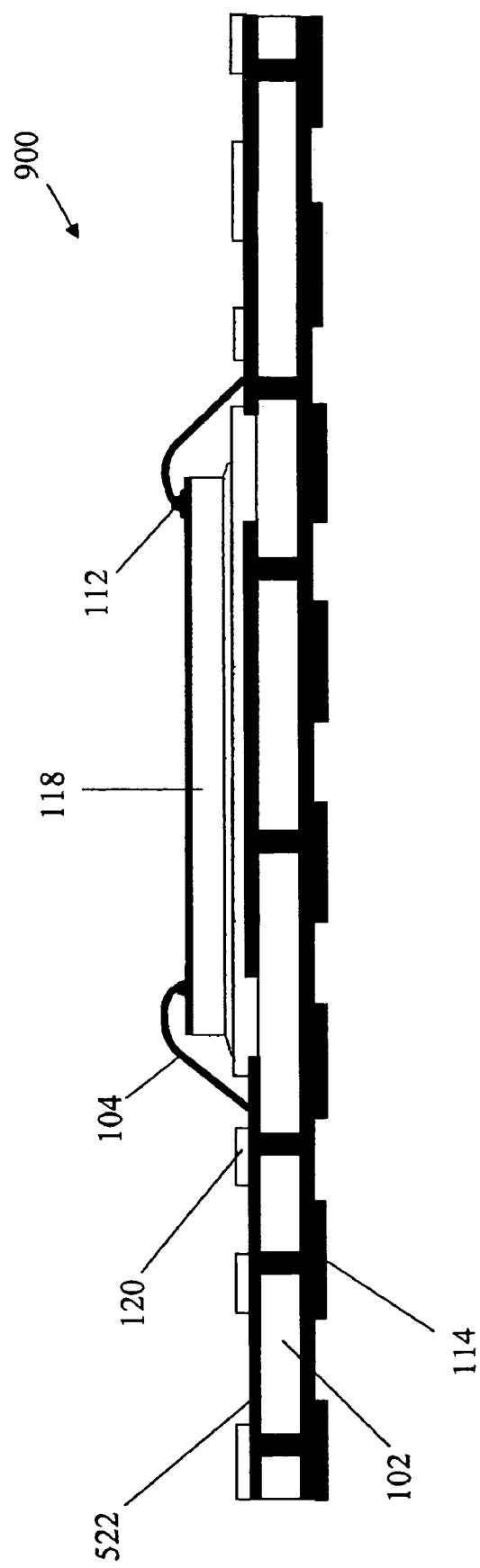
FIGS. 9A-9J illustrate a stacked IC package at different phases of assembly, according to an example embodiment of the present invention.

In step 804, a plurality of bond pads on a first surface of the IC die are coupled to a plurality of bond fingers on the first surface of the substrate. For example, FIG. 9A shows an IC package 900 in which wirebonds 104 couple bond pads 112 to bond fingers 120.

Figure 9B:
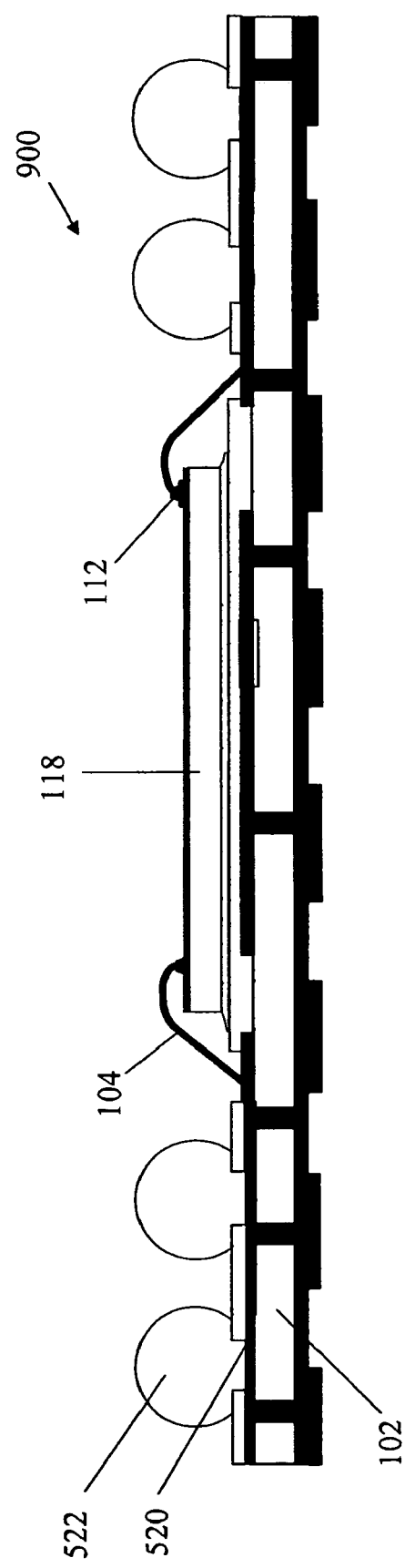

In step 806, a plurality of conductive elements is formed on the plurality of contact pads on the first surface of the substrate. For example, as shown in FIG. 9B, package 900 has a first plurality solder balls 522 formed on the top of solder ball pads 520. In alternate embodiments, other conductive elements may be formed on the plurality of contact pads, such as metallic posts.

Figure 9C:
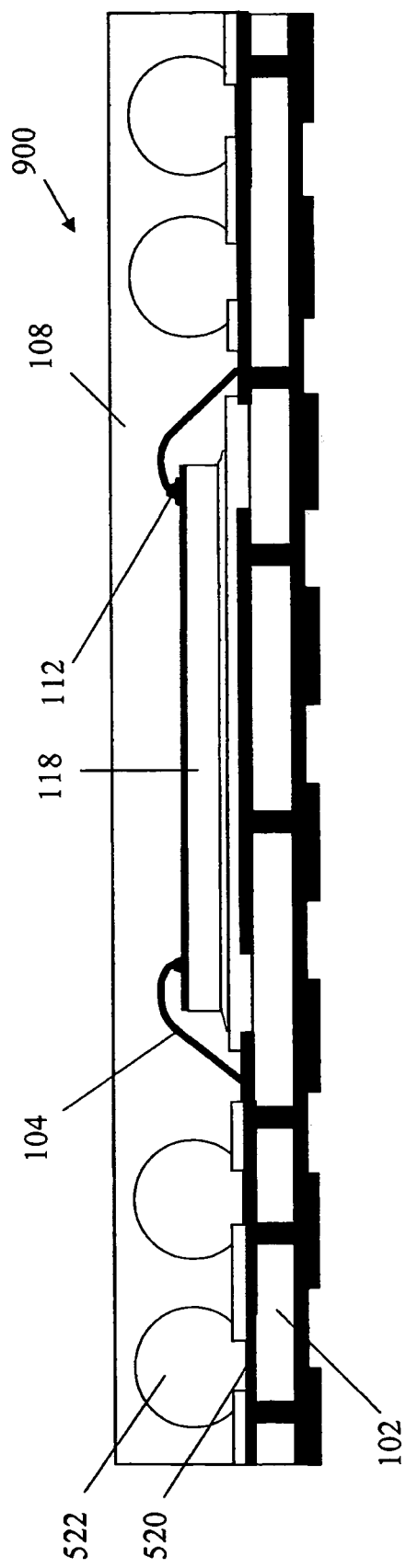

In step 808, the conductive elements and the IC die are encapsulated in encapsulation mold material. For example, as shown in FIG. 9C, IC die 118 and plurality of solder balls 522 are all encapsulated in an encapsulating material 108. The first plurality of solder balls may be encapsulated such that a portion of each solder ball remains exposed. Encapsulation may be done using a dam-and-fill process, a mold cap injection molding process, a strip or panel over-molding process or any other suitable encapsulation process as would be understood by persons skilled in the relevant art(s).

Figure 9D:
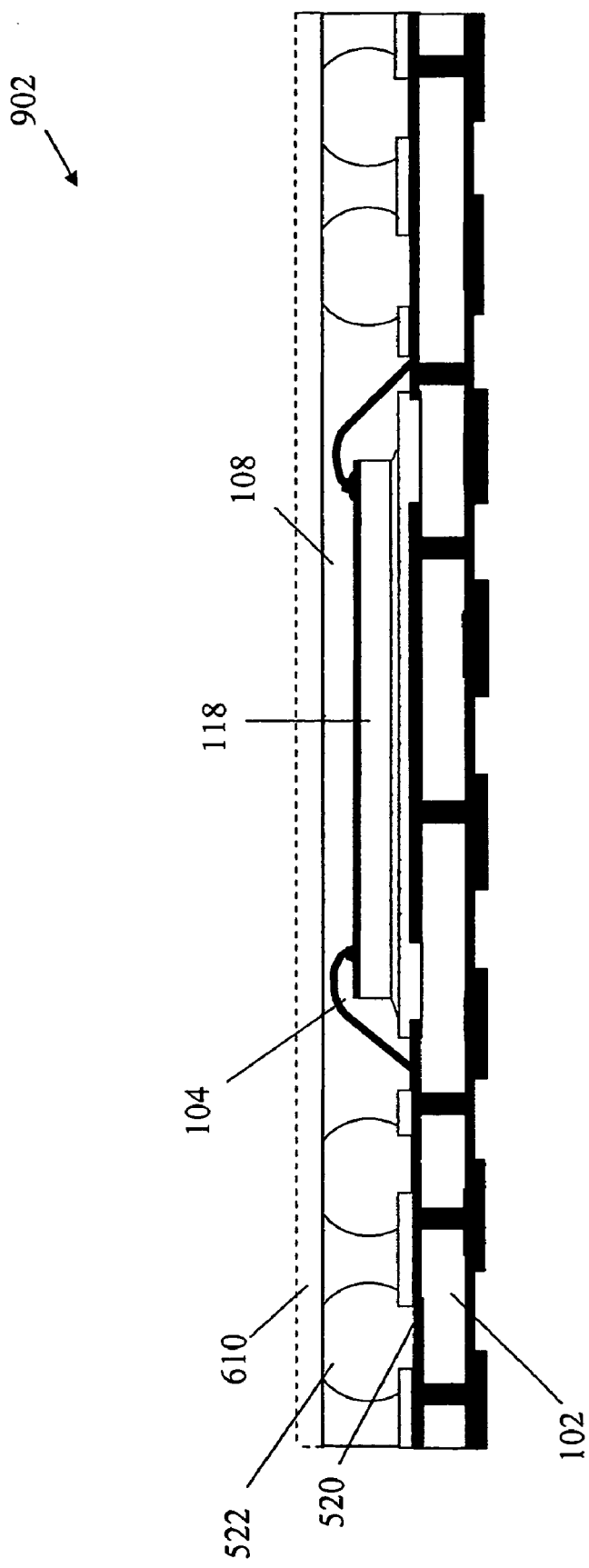
Figure 9E:
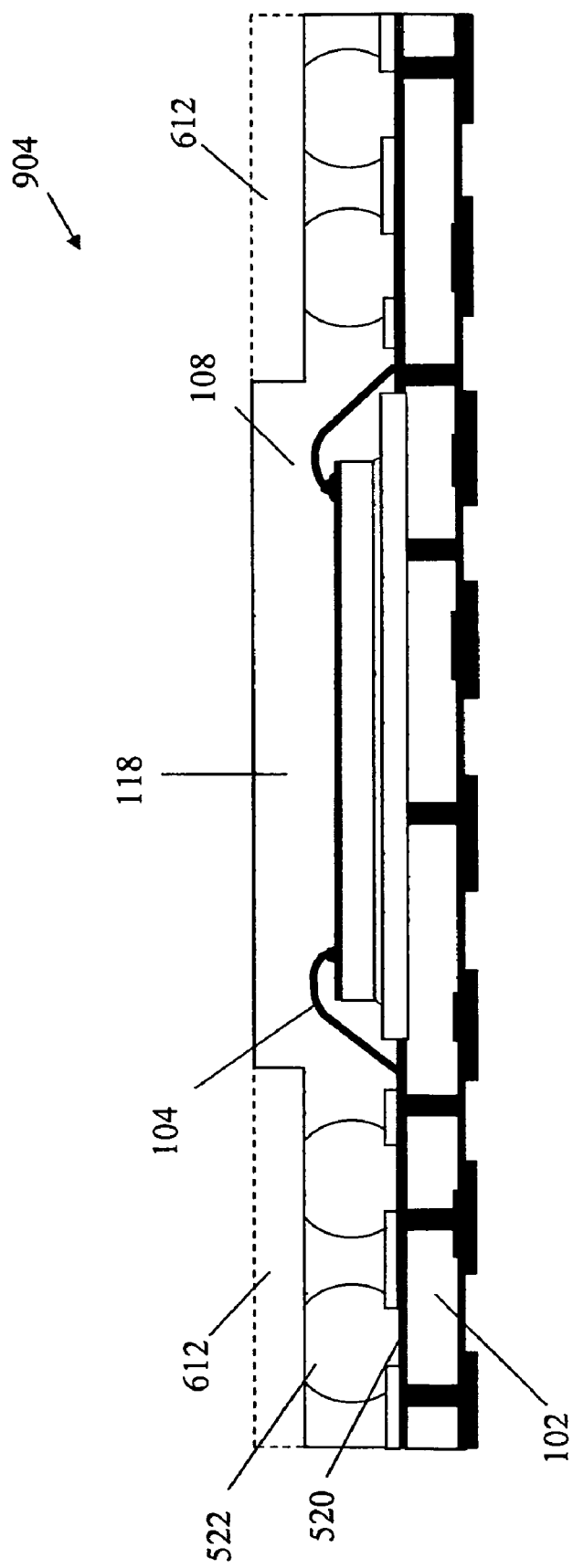
Figure 9F:
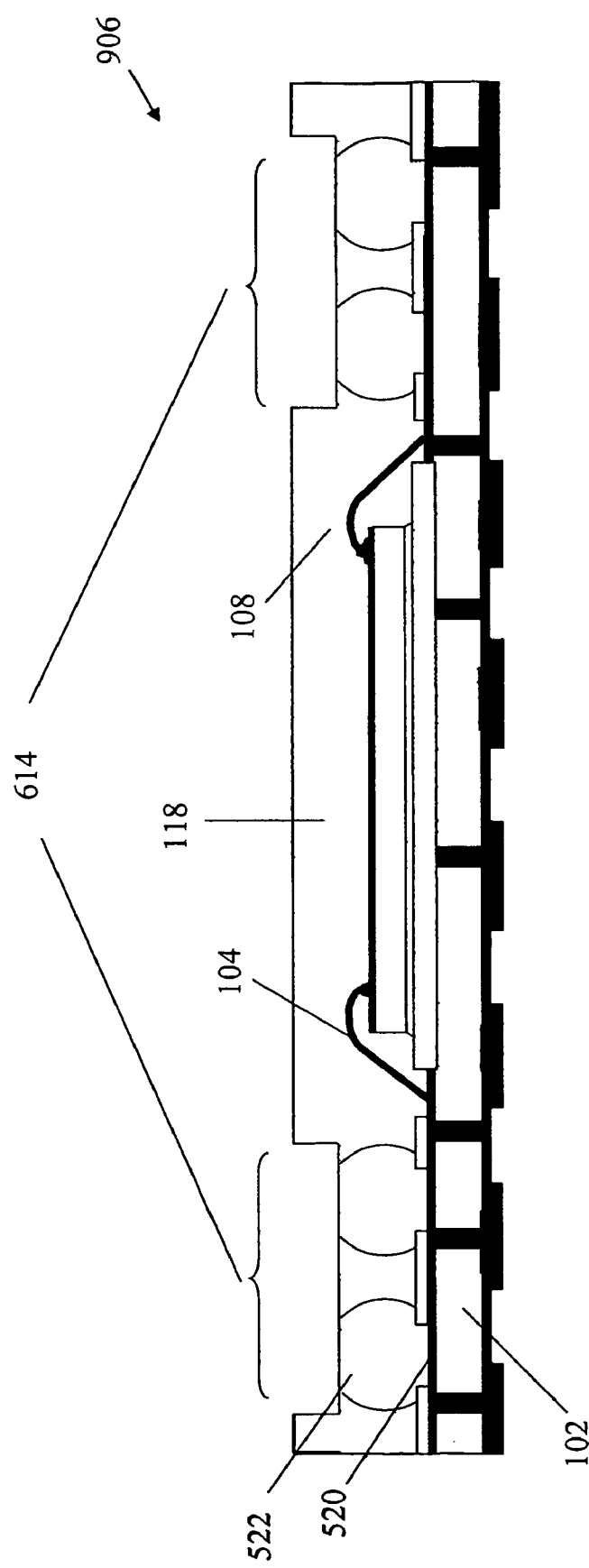

In step 810, a portion of the encapsulating material is removed to expose a portion of each conductive element of the plurality of conductive elements. The portion of the encapsulating material may be a planar layer, an edge portion, interior ring portion, or any other shape that exposes each conductive element of the plurality of conductive elements. For example, as shown in FIG. 9D, package 902 has a planar layer 610 of encapsulating material 108 removed to truncate and expose plurality of solder balls 522. As shown in FIG. 9E, package 904 has a portion 612 of encapsulating material 108 removed along a periphery of the top surface of encapsulating material 108 to truncate and expose plurality of solder balls 522. As shown in FIG. 9F in package 906, a trench 614 is formed by removing an interior ring portion of encapsulating material 108 to expose and truncate plurality of solder balls 522. The portion of the encapsulation material may be removed in a variety of ways such as etching with a chemical etchant, routing, grinding, etc., as would be understood by persons skilled in the relevant art(s).

Figure 9G:
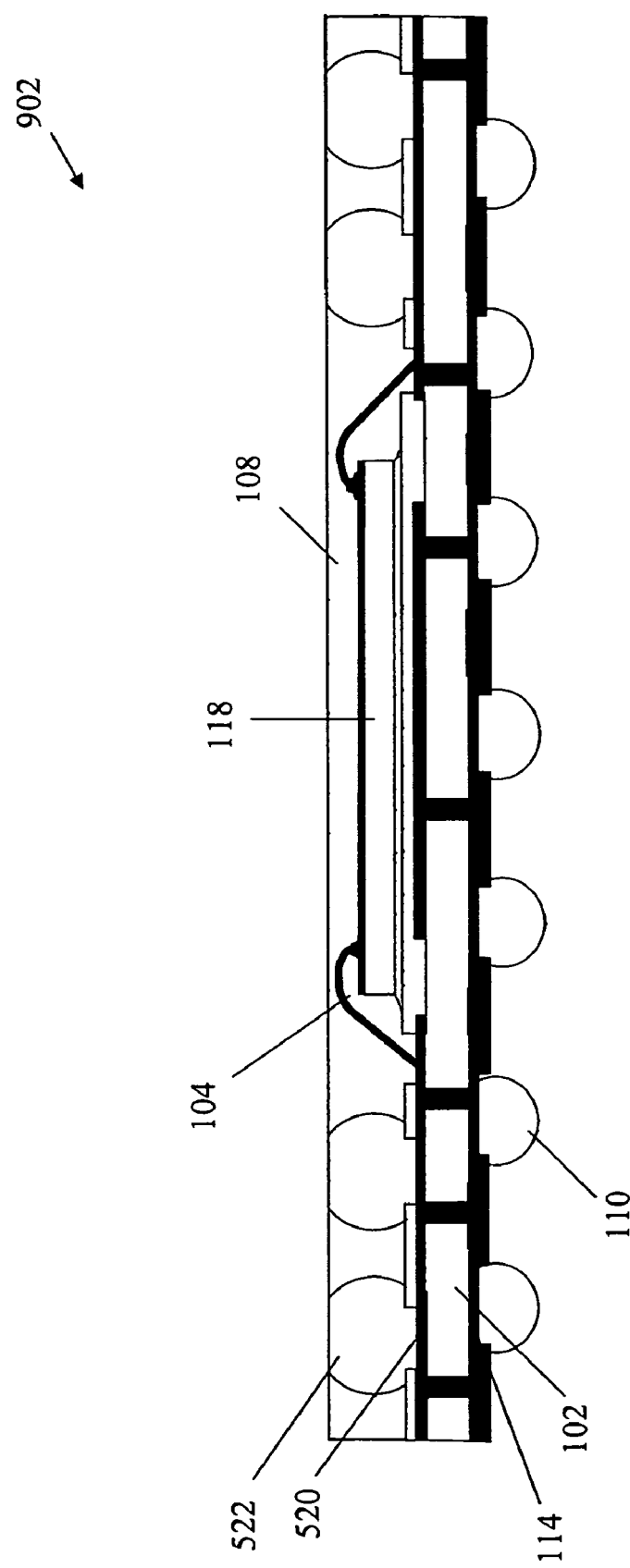

In step 812, a plurality of solder balls is formed on the plurality of conductive features on the second surface of the substrate. The second plurality of solder balls may be used to mount the entire package to a circuit board such as a PCB. For example, as shown in FIG. 9G, in package 902 solder balls 110 are attached to contact pads 114 on the second surface of substrate 102. FIG. 9G shows this step with package 902, but this and subsequent steps can also be carried out using packages 904 or 906. Moreover, other structures, such as conductive pins, may be coupled to the plurality of conductive features so that the package can be mounted to a circuit board.

Figure 9H:
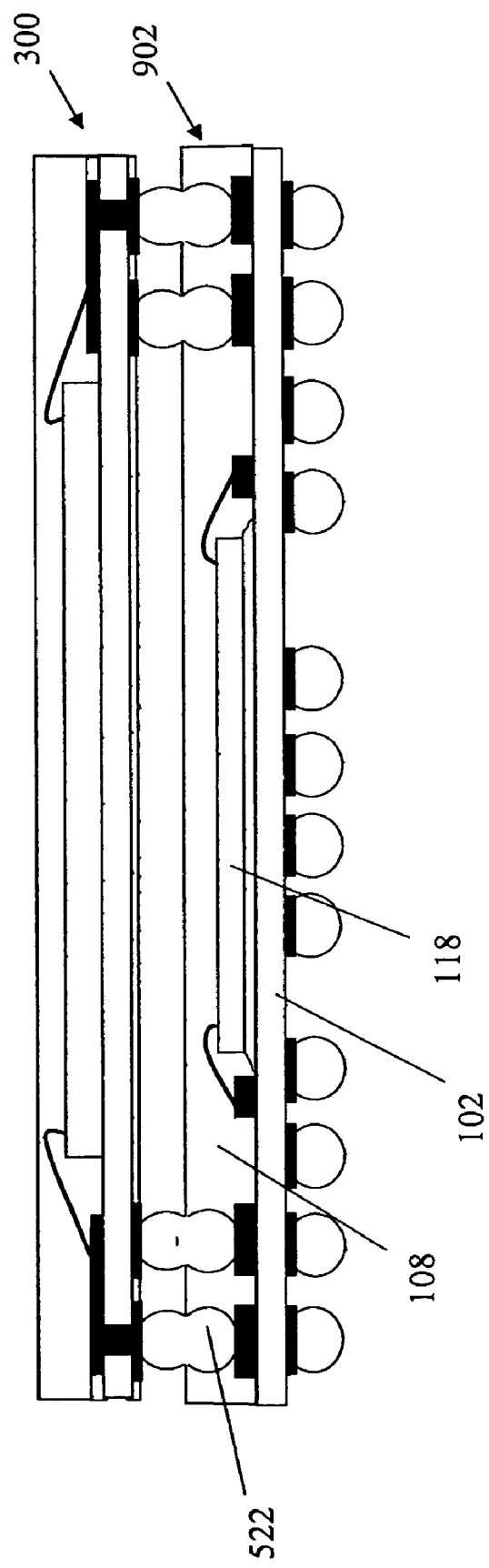

In step 814, an electrical component is attached to a first surface of the encapsulating material. For example, as shown in FIG. 9H, FBGA package 300 is attached to a first (e.g., top) surface of encapsulating material 108. Although FIG. 9H shows a FBGA package stacked on top of package 902, a variety of different electrical components can be mounted on top of package 902.

Figure 9I:
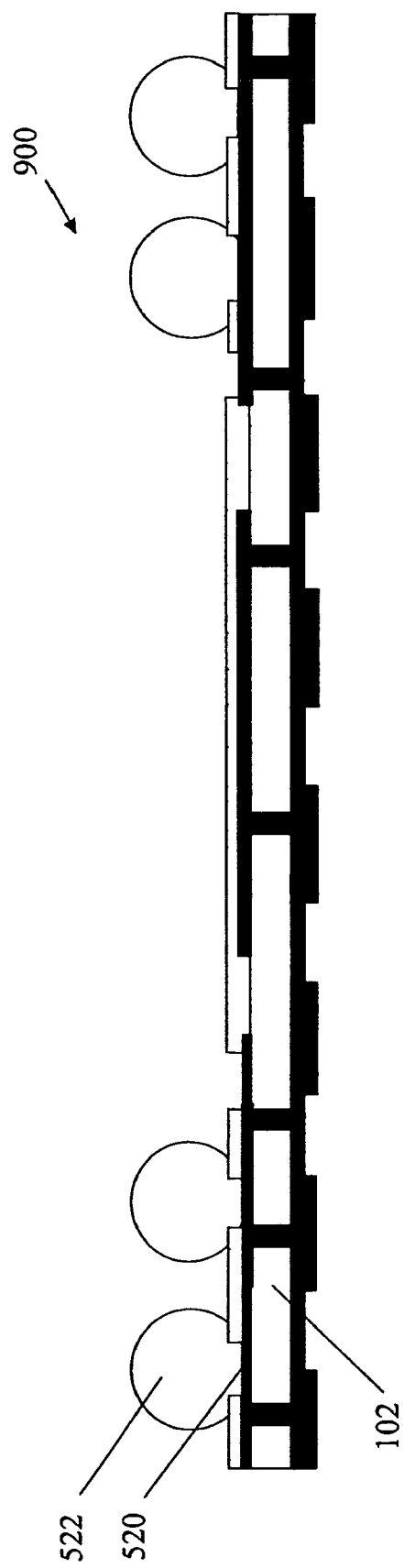
Figure 9J:
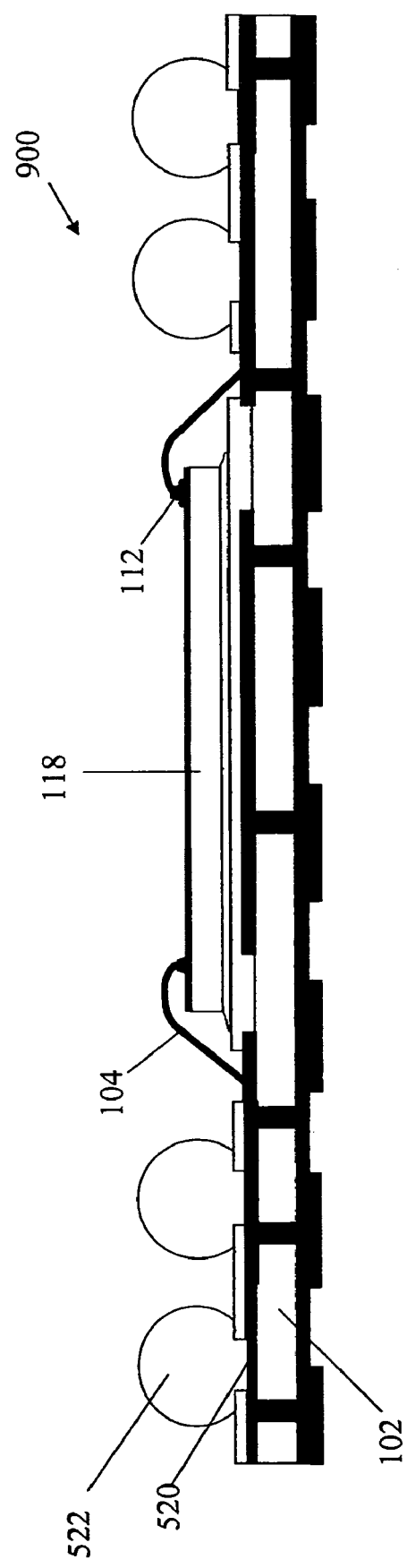

Steps in flowchart 800 may occur in another order than listed above. In particular, steps 804 and 806 may be reversed so that the plurality of conductive elements is formed on the contact pads on the first surface of the substrate and then the IC die is attached to the top surface of that substrate with the plurality of wirebonds coupled from the plurality of bond pads on a top surface of the IC die to bond fingers on the top surface of the substrate. For example, as shown in FIG. 9I, first plurality of solder balls 522 are attached to solder ball pads 520 on the top surface of substrate 102. Then in FIG. 9J, IC die 118 is attached to the top surface of substrate 102. Wirebonds 104 couple bond pads 112 on the first surface of the IC die 118 to bond fingers on the top surface of the substrate 102.

Furthermore, steps 812 and 814 can be reversed so that the FBGA package can be mounted on top before solder balls 110 are formed on the second surface of substrate 102.

Moreover, a dome over flat encapsulation technique can be used in which the top portion of each of the first plurality of solder balls is exposed. If this method of encapsulation is used, a portion of the encapsulation material does not have to be removed and the first plurality of solder balls do not have to be truncated to allow for a device or package to be stacked on top of the bottom FBGA. Thus, in this case step 810 may be skipped.

The steps indicated in flowchart 800 can also be used assemble packages that use different shaped conductive elements on the top surface of the substrate. In particular, the steps can be used to make a package that uses metallic posts to facilitate vertical interconnection. In this case steps 806 and 808 may be reversed since the posts can be put into place by forming a cylindrical cavity in the encapsulating material and placing the posts within the cylindrical cavity.

Furthermore, steps of flowchart 800 may also be used to assemble a stacked package in which the bottom package has a die-down configuration. In such an embodiment, step 804 becomes optional and may be omitted.

Figure 10A:
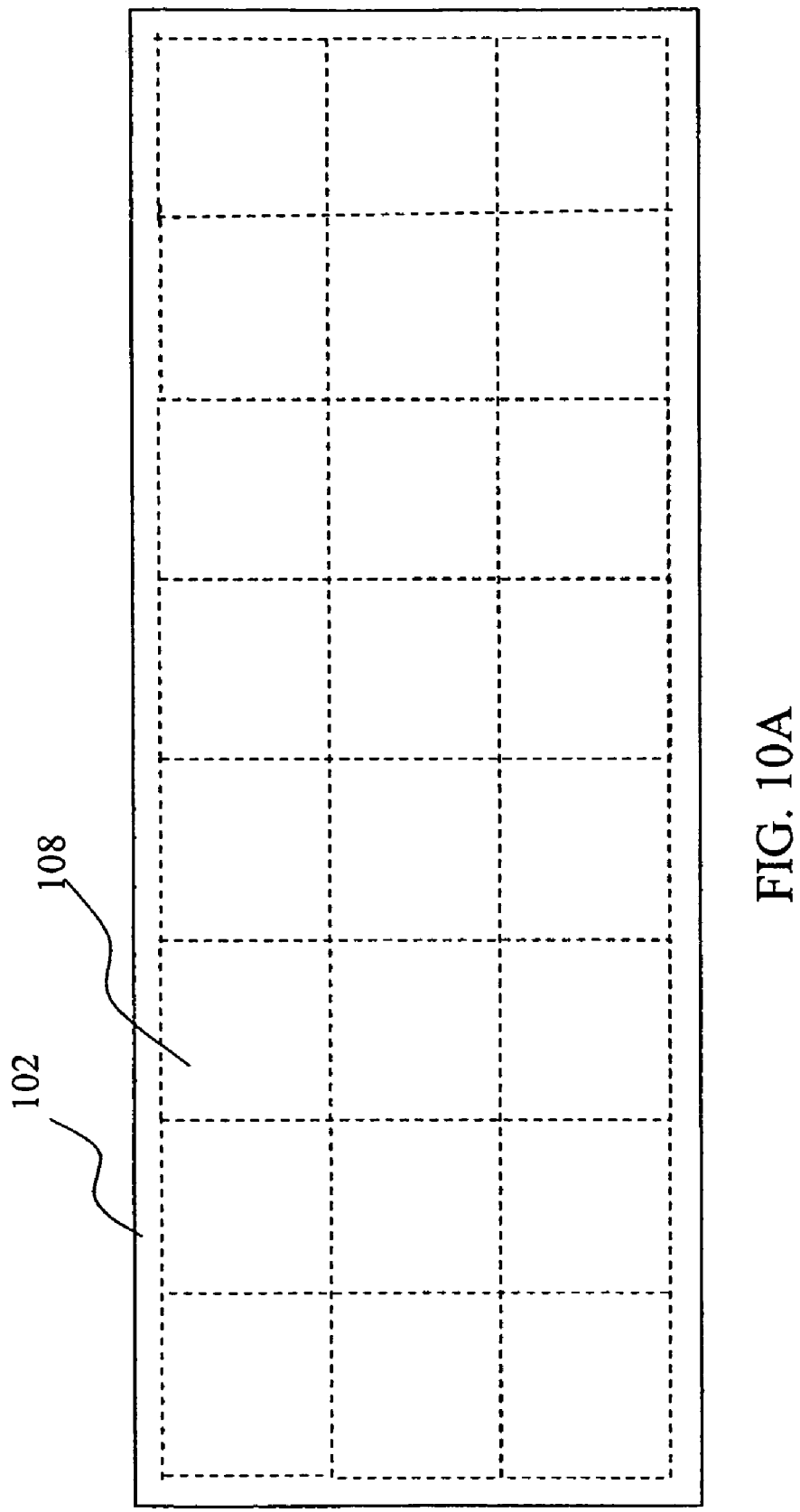
FIGS. 10A-10D show different methods of removing the encapsulating material.
Figure 10B:
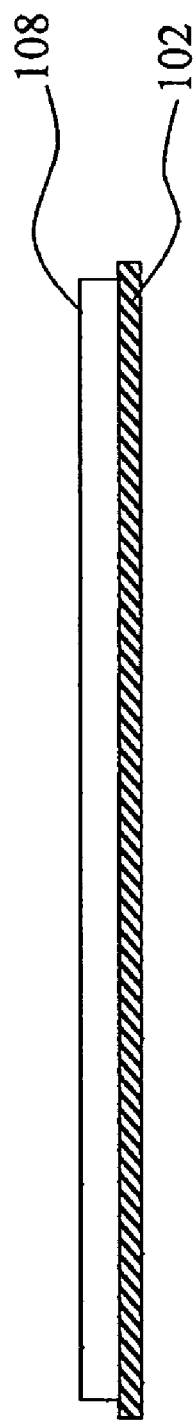
Figure 10C:
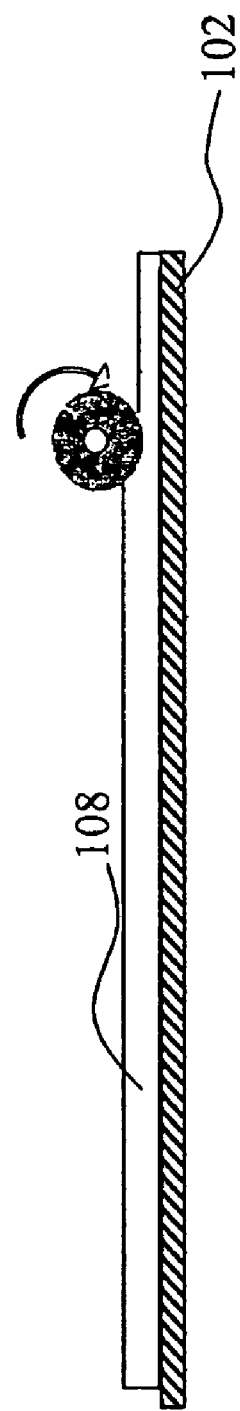
Figure 10D:
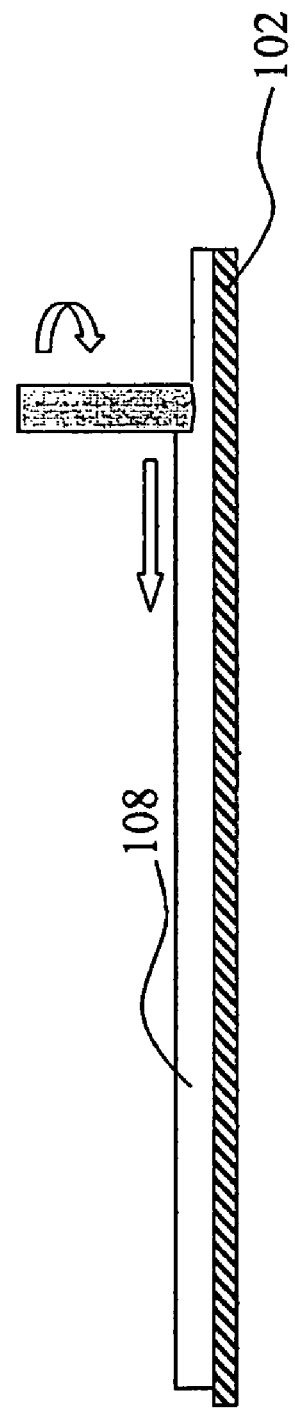

FIGS. 10A-10D, 11A-11B, 12A-12B, and 13A-13B show different methods of removing a portion of an encapsulating material to expose a plurality of conductive elements. FIG. 10A shows the top view and FIG. 10B shows the side view of an encapsulated substrate 102 before any portion of encapsulating material 108 has been removed. FIG. 10C shows how grinding could be used to remove a portion of the mold encapsulation compound 108. FIG. 10D shows how routing could be used to remove a portion the mold encapsulation compound 108.

Figure 11A:
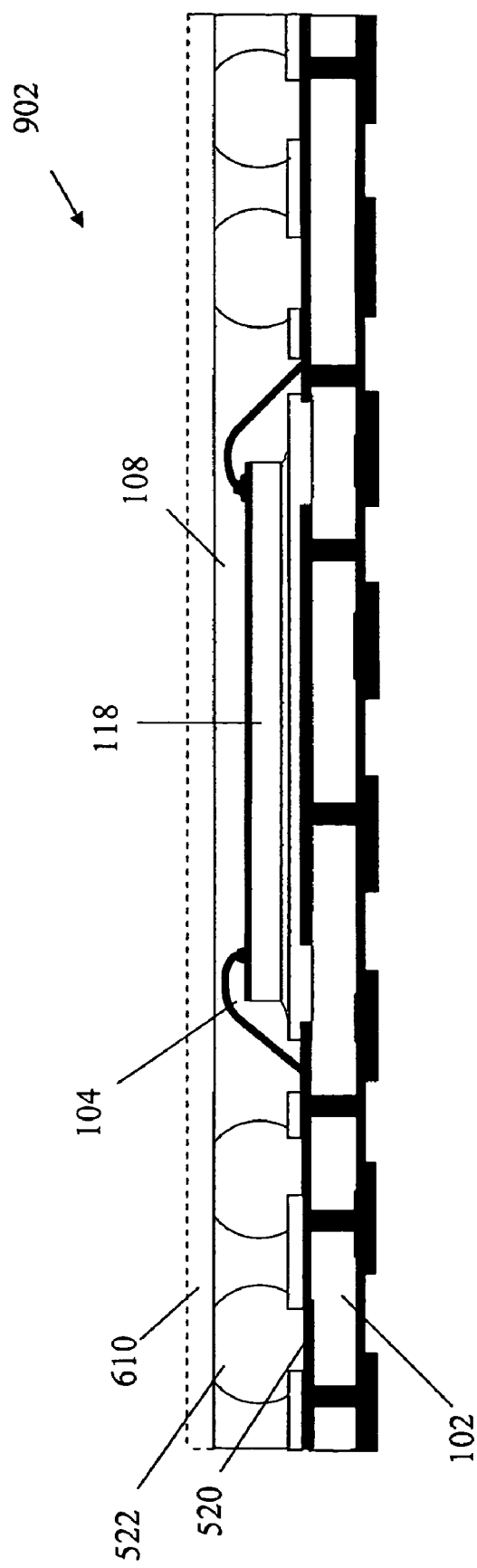
FIGS. 11A and 11B show the result of removing a planar portion of the encapsulating material.
Figure 11B:
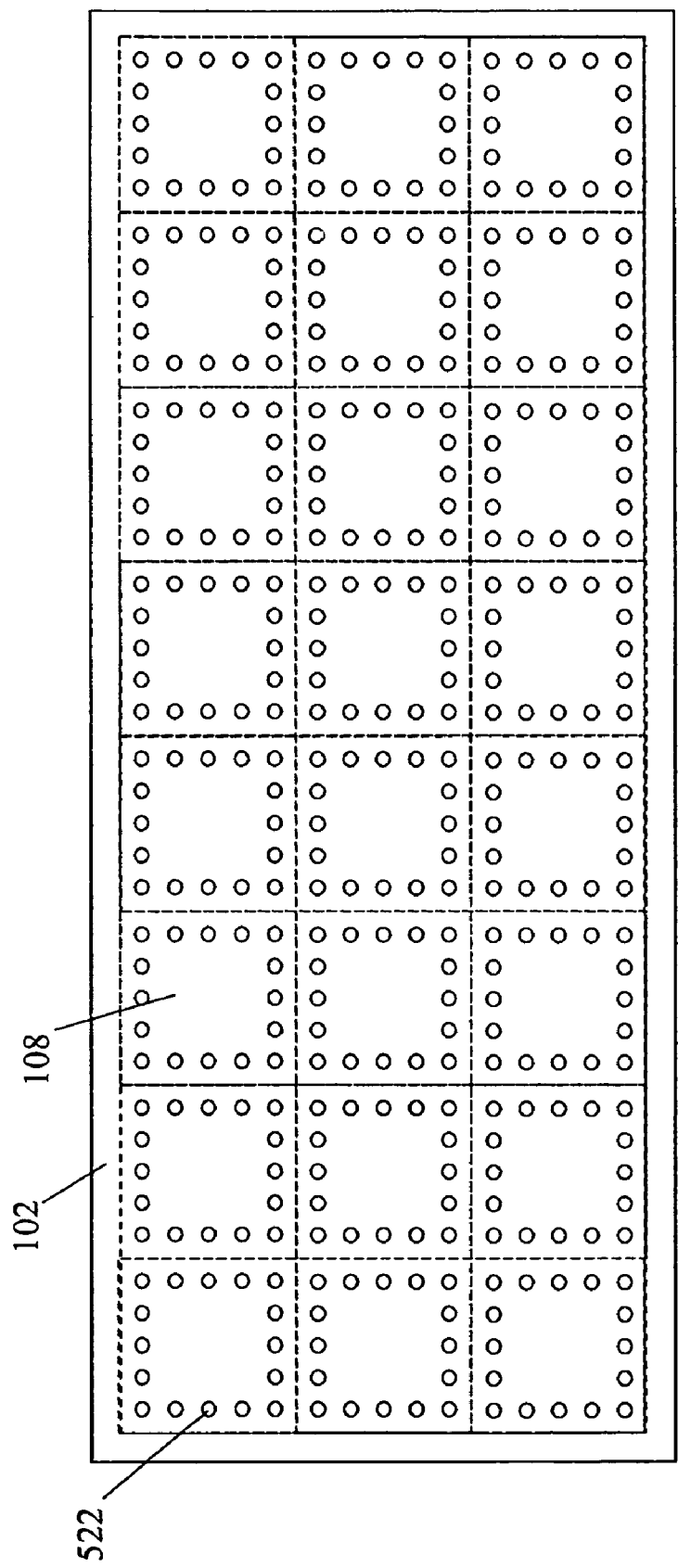

FIG. 11A shows a single unit cross-sectional view and FIG. 11B shows a top view of an entire encapsulated substrate after a planar portion of the encapsulating material is removed. As shown in FIG. 11B, truncated and exposed first plurality of solder balls 522 are at the same height as encapsulating material 108 over the entire substrate.

Figure 12A:
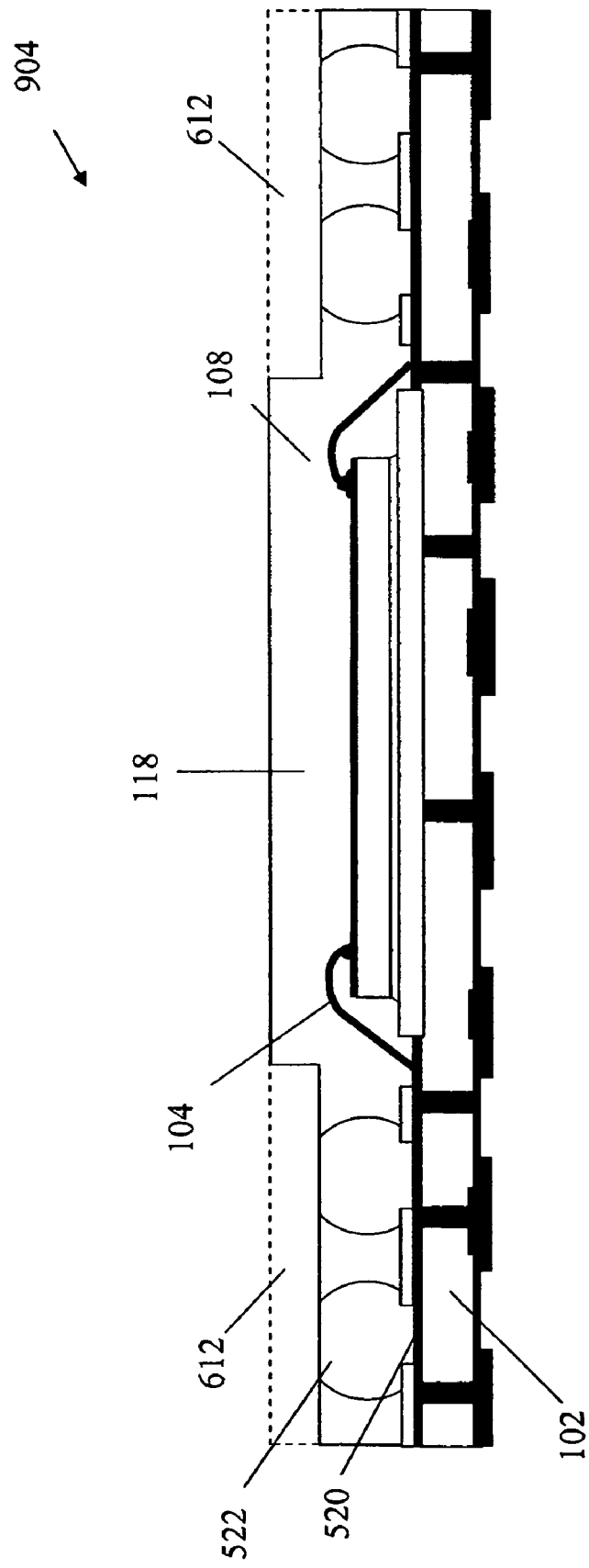
FIGS. 12A and 12B show the result of removing a portion of the encapsulating material along the periphery of the package.
Figure 12B:
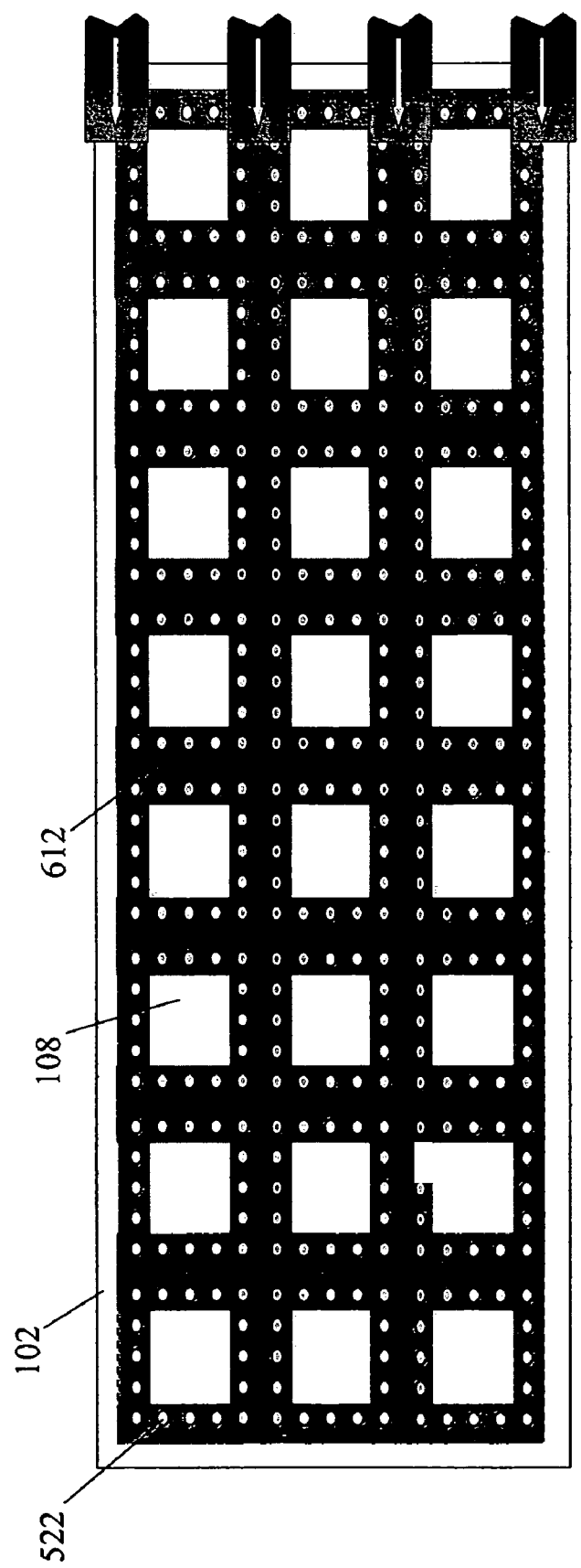

FIG. 12A shows a single unit cross-sectional view and FIG. 12B shows a top view of an entire encapsulated substrate after a portion 612 of the encapsulating material is removed along the periphery of the top surface of the encapsulating material of each package. As shown in FIG. 12B a center portion of each die protrudes higher than the peripheral regions where the first plurality truncated solder balls 522 are located.

Figure 13A:
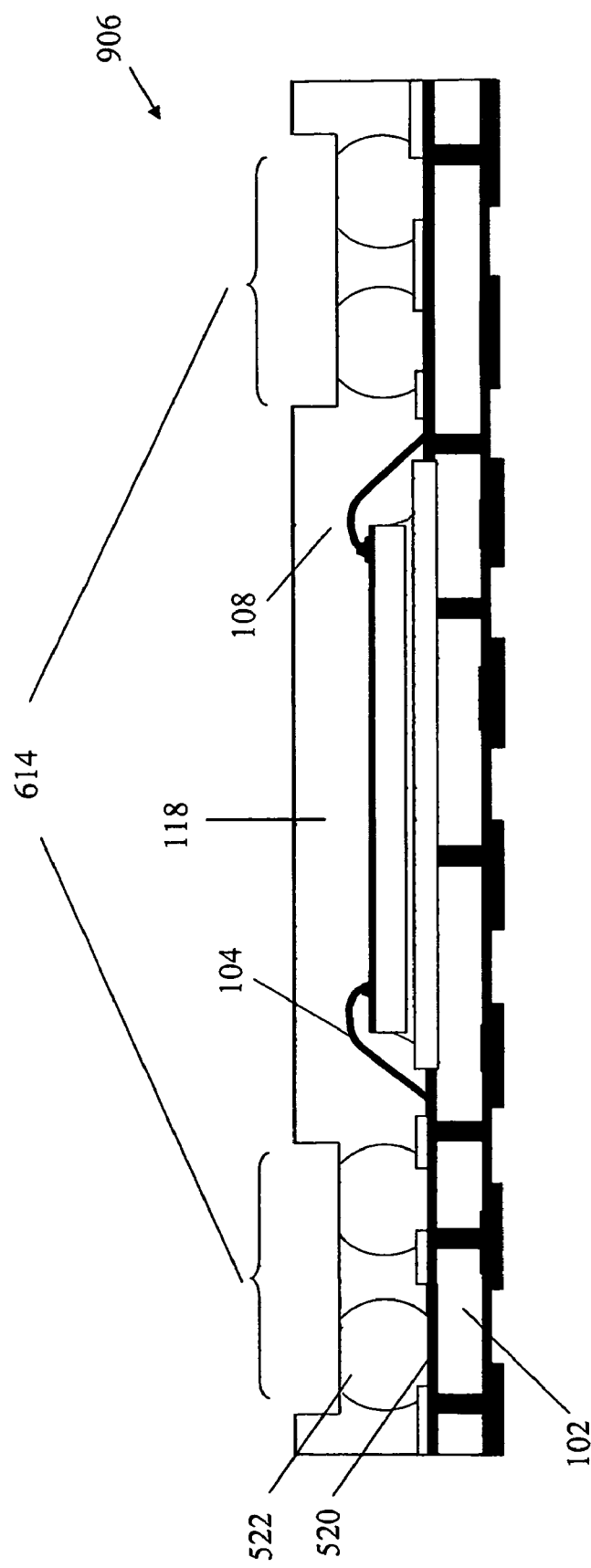
FIGS. 13A and 13B show the result of forming a trench in the encapsulating material.
Figure 13B:
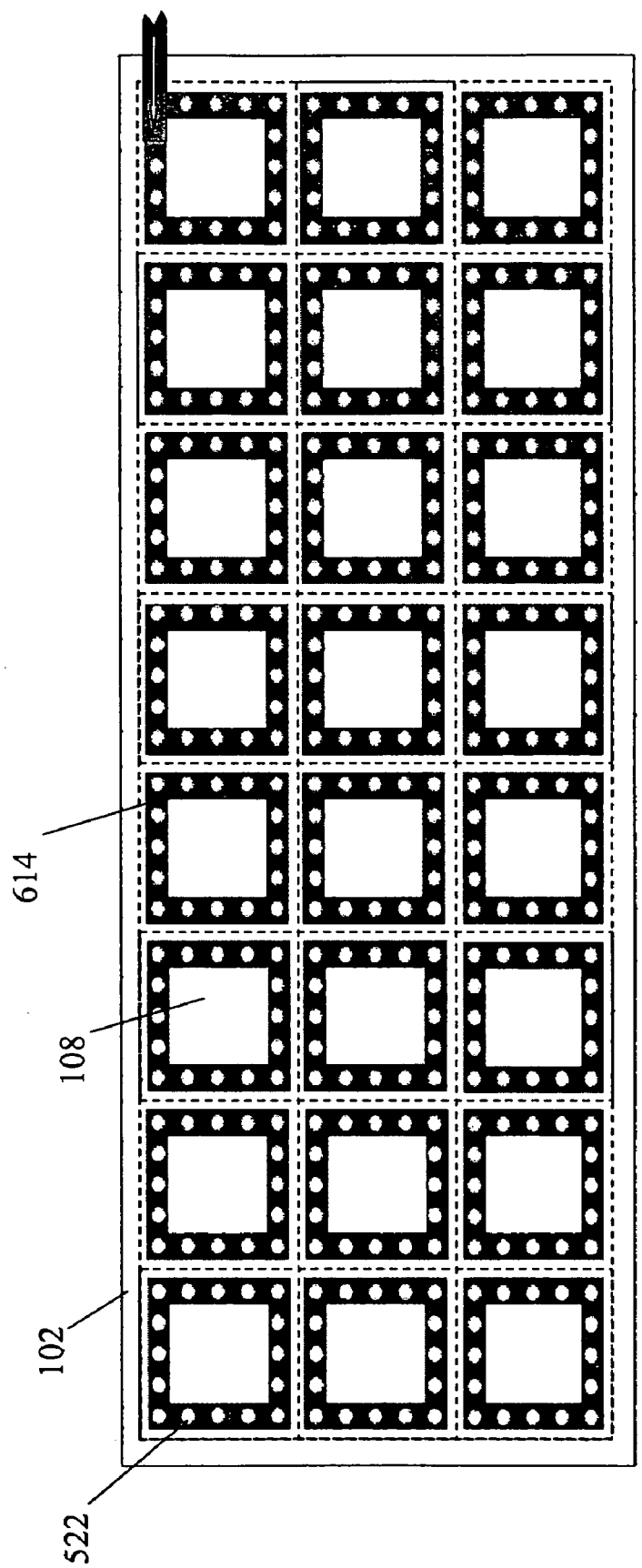

FIG. 13A shows a single unit cross-sectional view and FIG. 13B shows a top view of an entire molded substrate after a trench 614 is formed in the mold encapsulation layer 108 of each die. As shown in FIG. 13B a rectangular ring shaped trench 908 is formed in each of the IC dies.

Figure 14A:
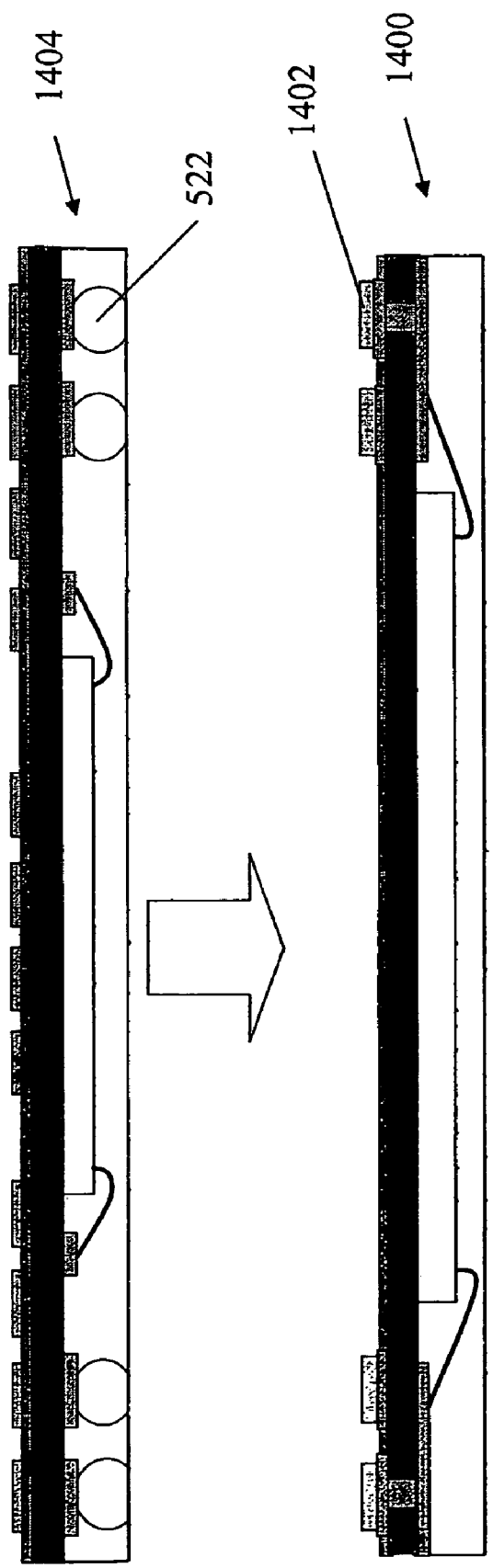
FIGS. 14A and 14B show how an LGA package can be mounted on top of a BGA package according to the present invention.
Figure 14B:
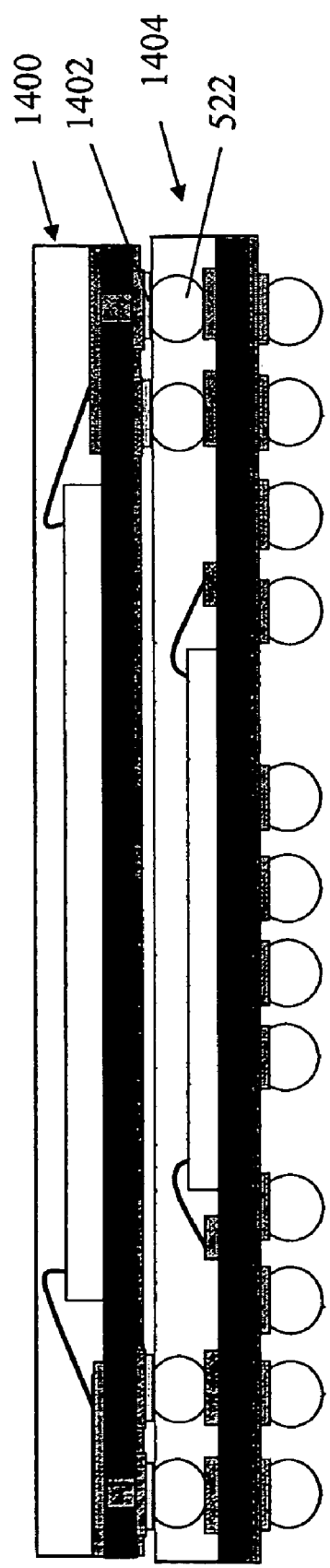

FIGS. 14A-14B show a process of mounting a LGA package on top of a BGA package, in accordance with the present invention. In FIG. 14A solder paste is applied to a plurality of ball pads 1402 of LGA package 1400. The plurality of ball pads 1402 correspond to a plurality of truncated solder balls 522 which are accessible through a top surface of a FBGA package 1404. In FIG. 14B the LGA package 1400 is mounted on top of BGA package 1404 and can be attached using conventional reflow surface mount processes.

Example Advantages

Embodiments of the present invention provide many advantages over conventional BGA packages, including those described above with respect to FIGS. 1-4. Some of these advantages are described below. Each advantage described below does not necessarily apply to each embodiment described herein. Furthermore, the advantages provided by embodiments of the present invention are not necessarily limited to those described below.

(1) Packages according to embodiments of the present invention allow the mold encapsulation layer of the bottom package to span the entire surface of the substrate and allow the size of the IC package not to be limited by the size of the mold chase. Package footprint size for the bottom package can also be minimized for a given IC die size.

(2) Electrical interconnect pads on the top surface of the encapsulation material allow for fine pitch ball grid array (FBGA) packages shown in FIG. 3 and other chip scale packages that do not have a substantial portion of the top surface of the substrate exposed (e.g., not covered by encapsulating material) to be the bottom package in a stacked package.

(3) The truncated solder ball pads allow for both surface mount and through-hole packages to be the top package in the stacked package. Since the solder balls melt at a temperature above the solder ball melting point a cavity can be formed to accept both surface mount and through-hole terminals.

(4) The contact terminal pads on the encapsulating material top surface are formed by solder balls truncated on top, so these contact pads can be easily wetted by solder and fused with terminal leads of another BGA package. These contact pads on the encapsulating material top can also be easily fused with other types of terminal leads because they are formed by solder balls.

(5) The height of the entire package can be reduced by using smaller solder balls for the top package or removing the solder balls entirely and replacing them with solder paste placed on top of contact pads as shown in FIG. 14.

(6) The solder ball-made contact pads provide better reliability than conventional copper/nickel/gold pads for the solder joint because there is no intermetallic compound (IMC) formation on these terminal pads that can reduce solder joint strength.

(7) The contact pads on the package mold top are formed using conventional processes for solder ball mount, molding, and machining widely employed in assembly houses.

(8) Since the interconnect contact pads are on the top of package mold they can be easily identified and accessed. Assembly through-put and yield of package stacking process can be improved because the contact pads can be easily accessed and because the contact pads are made of solder that can wet the interconnect terminals of the top package.

(9) The encapsulating material that covers the entire top surface of the bottom package provides mechanical support and stiffening. The mechanical support for package-to-package interconnection is provided by the encapsulating material of the bottom package and does not rely on the stiffness of the bottom package substrate. Thus thin as well as extremely flexible substrates, including tape based and thin core BT based substrates, can be used for both the top and bottom packages.

Conclusion

While various embodiments of the present invention have been described above, it should be understood that they have been presented by way of example only, and not limitation. It should be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
a substrate having opposing first and second surfaces;
a plurality of contact pads on the first surface of the substrate electrically connected to a plurality of electrically conductive features on the second surface of the substrate;
an integrated circuit (IC) die mounted to the first surface of the substrate;
a plurality of conductive elements formed on the plurality of contact pads on the first surface of the substrate; and
an encapsulating material that encapsulates the IC die and the plurality of conductive elements, wherein a surface of the encapsulating material comprises a first portion and a second portion, wherein the first portion and the second portion are non-planar, wherein the second portion is a depression formed in the surface of the encapsulating material, and wherein the second portion exposes a portion of each conductive element of the plurality of conductive elements.

2. The package of claim 1, wherein the second portion is a shelf formed in the encapsulating material.

3. The package of claim 1, the second portion is a trench formed in the encapsulating material.

4. The package of claim 1, wherein a plurality of solder balls is formed on the electrically conductive features on the second surface of the substrate.

5. The package of claim 1, wherein the plurality of conductive elements comprises a plurality of solder balls.

6. The package of claim 1, wherein the plurality of conductive elements comprises a plurality of metallic posts.

7. The package of claim 1, wherein the substrate is a flex tape substrate.

8. The package of claim 1, wherein the IC die is mounted to the first surface of the substrate using an adhesive.

9. The package of claim 1, further comprising:
a wirebond that couples a bond pad on a first surface of the IC die to a bond finger on the first surface of the substrate.

10. The package of claim 1, further comprising:
an electrical component mounted to the surface of the encapsulating material such that a plurality of electrically conductive members of the electrical component is electrically coupled to the plurality of conductive elements.

11. The package of claim 10, wherein the electrical component is a ball-grid array (BGA) package, land-grid array (LGA) package, or a through-hole package.

12. An integrated circuit (IC) package, comprising:
a substrate having opposing first and second surfaces;
a plurality of contact pads on the first surface of the substrate electrically connected to a plurality of electrically conductive features on the second surface of the substrate;
an integrated circuit (IC) die mounted to the first surface of the substrate;
a plurality of conductive elements formed on the plurality of contact pads on the first surface of the substrate;
an encapsulating material that encapsulates the IC, die and the plurality of conductive elements, wherein a portion of each conductive element of the plurality of conductive elements is exposed at a surface of the encapsulating material; and
an electrical component mounted to the surface of the encapsulating material such that a plurality of electrically conductive members of the electrical component is electrically coupled to the plurality of conductive elements, wherein the electrical component is at least one of a resistor, capacitor, or inductor.

13. The package of claim 12, wherein the surface of the encapsulating material is planar.

14. The package of claim 12, wherein a plurality of solder balls is formed on the electrically conductive features on the second surface of the substrate.

15. The package of claim 12, wherein the plurality of conductive elements comprises a plurality of solder balls.

16. The package of claim 12, wherein the plurality of conductive elements comprises a plurality of metallic posts.

17. The package of claim 12, wherein the substrate is a flex tape substrate.

18. The package of claim 12, wherein the IC die is mounted to the first surface of the substrate using an adhesive.

19. The package of claim 12, further comprising:
a wirebond that couples a bond pad on a first surface of the IC die to a bond finger on the first surface of the substrate.

20. The package of claim 12, wherein the surface of the encapsulating material is non-planar.

21. The package of claim 20, wherein the surface of the encapsulating material comprises a shelf formed in the encapsulating material that exposes a portion of at least one conductive element.

22. The package of claim 20, wherein the surface of the encapsulating material comprises a trench formed in the encapsulating material that exposes a portion of at least one conductive element.

* * * * *